(12) United States Patent
Okumura

(10) Patent No.: US 9,905,518 B2
(45) Date of Patent: Feb. 27, 2018

(54) METHOD OF MANUFACTURING A SEMICONDUCTOR DEVICE

(71) Applicant: ROHM CO., LTD., Kyoto (JP)

(72) Inventor: Hiroshi Okumura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/593,408

(22) Filed: May 12, 2017

(65) Prior Publication Data

US 2017/0250148 A1 Aug. 31, 2017

Related U.S. Application Data

(62) Division of application No. 14/936,837, filed on Nov. 10, 2015, now Pat. No. 9,673,159.

(30) Foreign Application Priority Data

Nov. 10, 2014 (JP) .................................. 2014-228463

(51) Int. Cl.
*H01L 23/00* (2006.01)

(52) U.S. Cl.
CPC ............. *H01L 24/02* (2013.01); *H01L 24/05* (2013.01); *H01L 24/13* (2013.01); *H01L 2224/024* (2013.01); *H01L 2224/0239* (2013.01); *H01L 2224/02311* (2013.01); *H01L 2224/02373* (2013.01); *H01L 2224/0401* (2013.01); *H01L 2224/05008* (2013.01); *H01L 2224/13014* (2013.01); *H01L 2224/13024* (2013.01); *H01L 2924/01029* (2013.01); *H01L 2924/07025* (2013.01); *H01L 2924/35121* (2013.01)

(58) Field of Classification Search
CPC .......... H01L 24/02; H01L 24/05; H01L 24/13
See application file for complete search history.

(56) References Cited

U.S. PATENT DOCUMENTS

| | | | |
|---|---|---|---|
| 2003/0218246 A1 | 11/2003 | Abe et al. | |
| 2007/0194445 A1 | 8/2007 | Aiba | |
| 2010/0109167 A1 | 5/2010 | Gee et al. | |
| 2014/0252610 A1 | 9/2014 | Chen et al. | |

FOREIGN PATENT DOCUMENTS

| | | | |
|---|---|---|---|
| JP | 2000-150557 A | 5/2000 | |
| JP | 2013-026404 A | 2/2013 | |

*Primary Examiner* — Peniel M Gumedzoe
(74) *Attorney, Agent, or Firm* — Rabin & Berdo, P.C.

(57) ABSTRACT

A method of manufacturing a semiconductor device forming a pad on the semiconductor substrate. A rewiring is formed that is electrically connected to the pad and led to a region outside the pad. A resin layer is formed on the rewiring. An external terminal is electrically connected to the rewiring via the resin layer. The resin layer is formed so as to enter the inside of a slit formed in a region along the periphery of the external terminal in the rewiring.

9 Claims, 19 Drawing Sheets

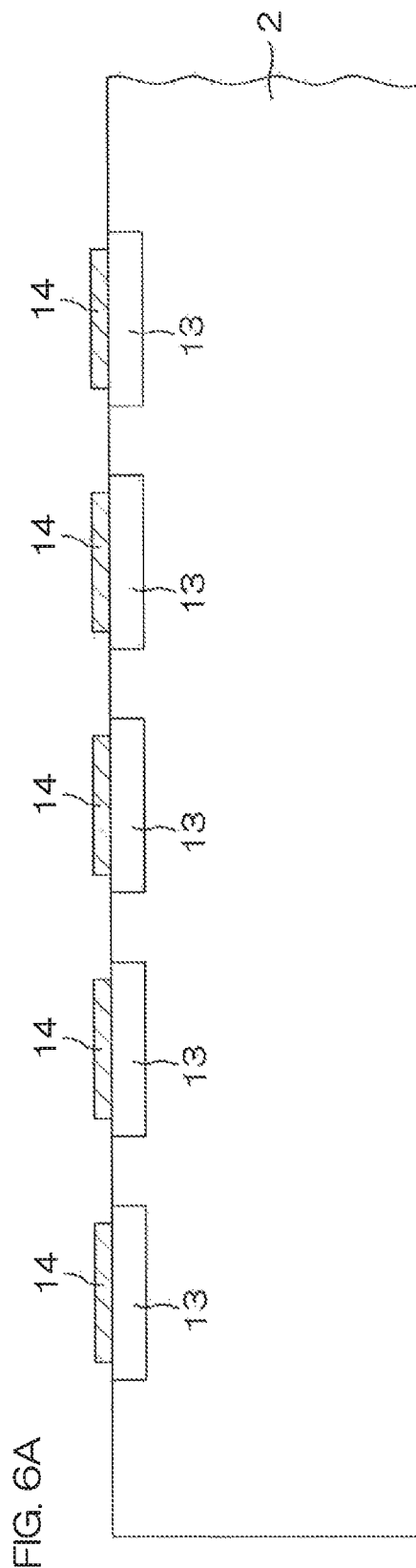

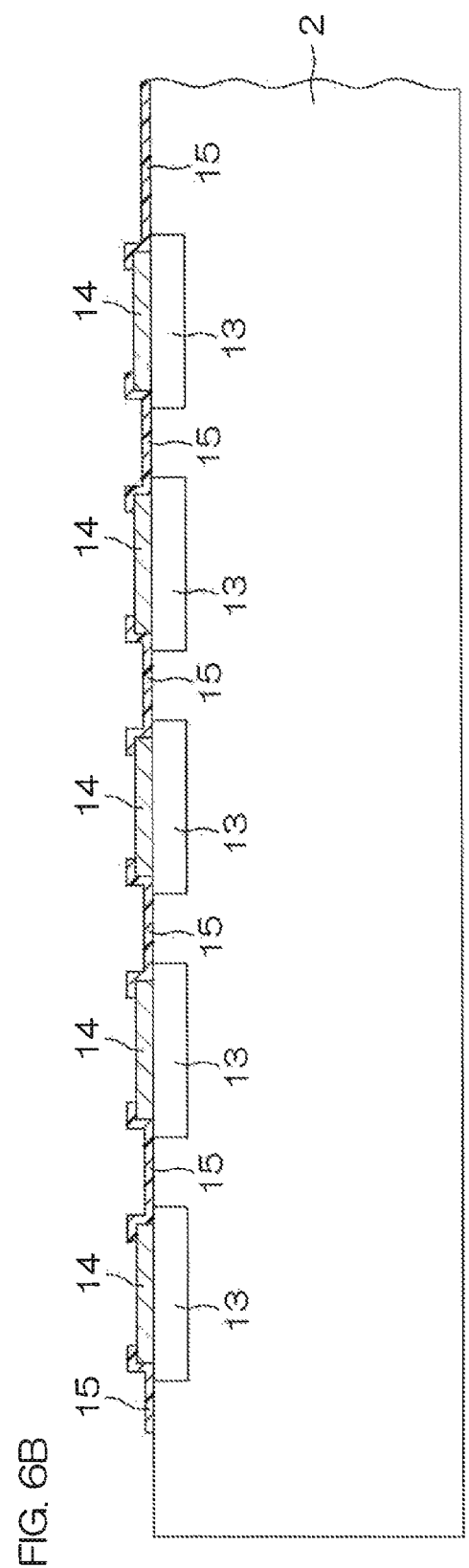

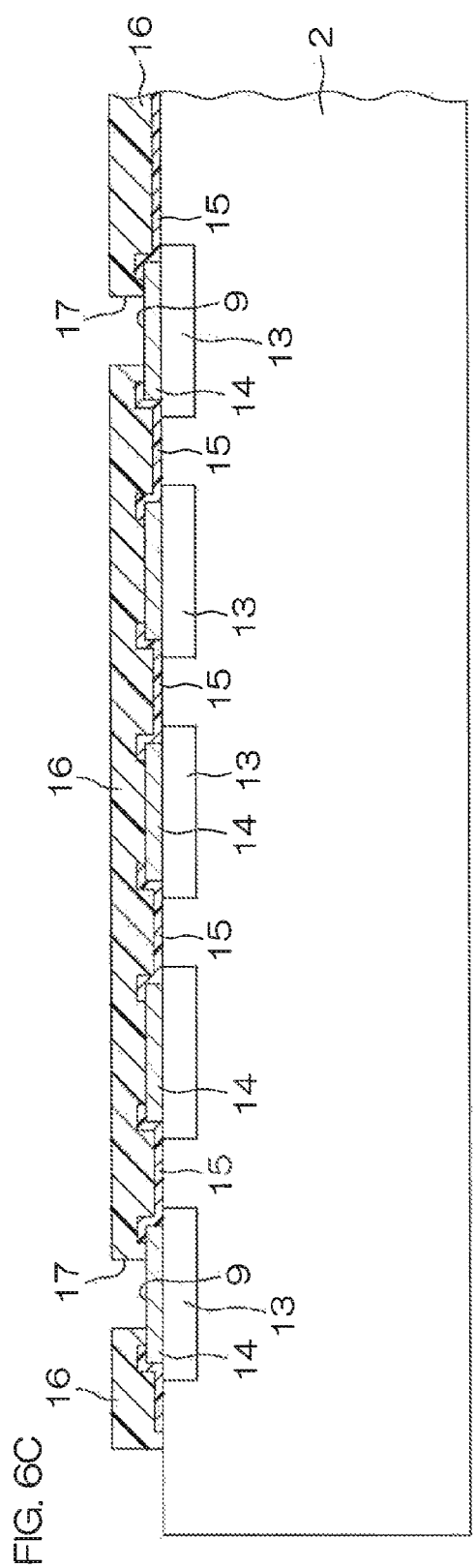

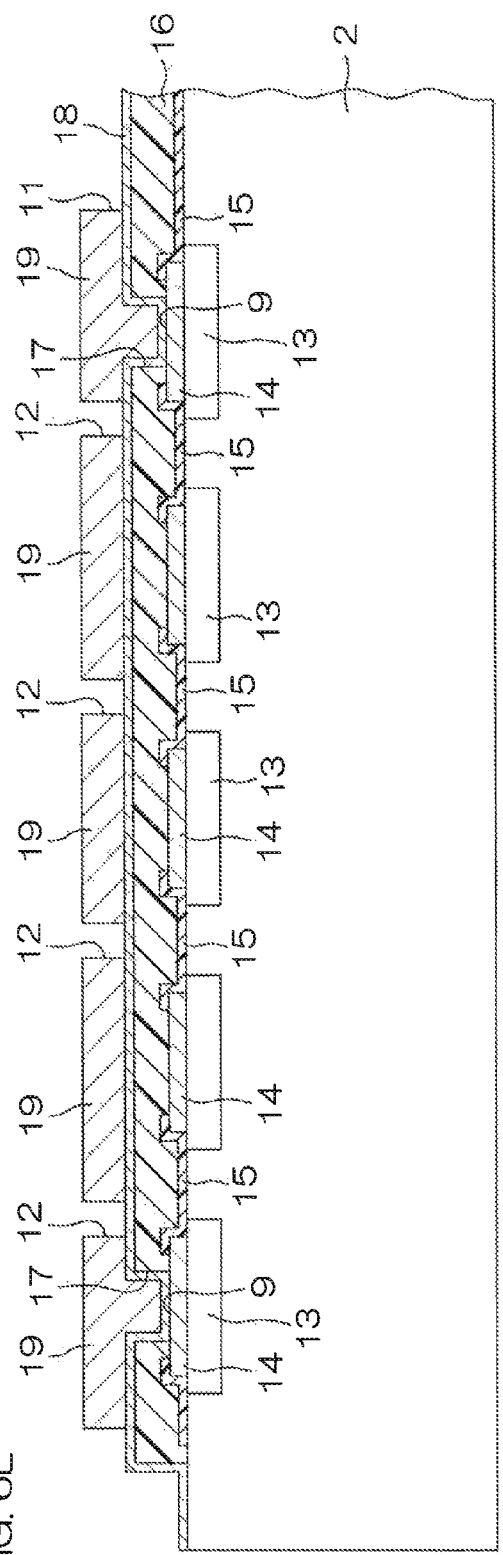

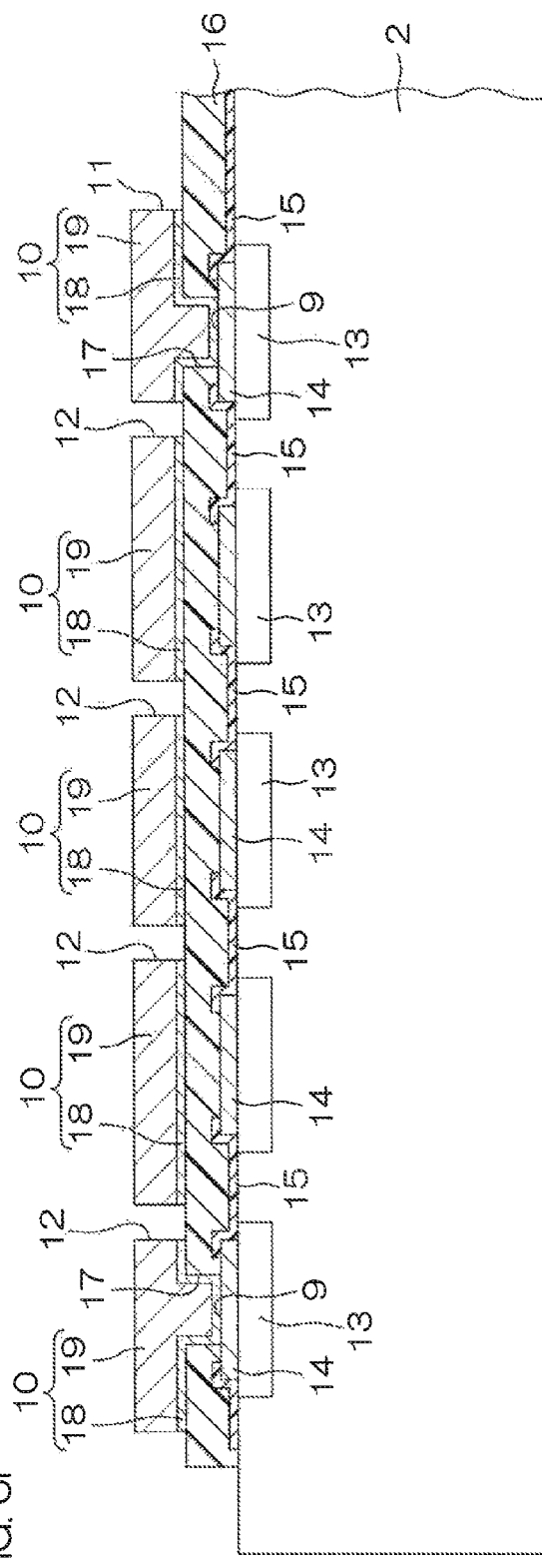

METHOD OF MANUFACTURING A SEMICONDUCTOR DEVICE

CROSS-REFERENCE TO RELATED APPLICATIONS

This application is a division of application Ser. No. 14/936,837, filed on Nov. 10, 2015 (allowed on Feb. 8, 2017), which claims the benefit of priority of Japanese Application No. 2014-228463, filed in the Japan Patent Office on Nov. 10, 2014. The disclosures of these prior U.S. and foreign applications are incorporated herein by reference.

TECHNICAL FIELD

The present invention relates to a semiconductor device and a manufacturing method for the same.

BACKGROUND ART

A CSP IC including a semiconductor substrate, electrode pads formed on the semiconductor substrate, external terminals connected to the electrode pads, and a resin sealing film that exposes the external terminals is disclosed in Patent Document 1 (Japanese Patent Application Publication No. 2000-150557).

SUMMARY OF INVENTION

An object of the present invention is to provide a semiconductor device in which pealing of a resin layer from rewiring can be suppressed, and a manufacturing method for the same.

BRIEF DESCRIPTION OF DRAWINGS

FIG. 6A to FIG. 6K are sectional views for describing an example of steps of manufacturing the semiconductor device shown in FIG. 1, corresponding to FIG. 4.

DESCRIPTION OF EMBODIMENTS

Figure 1:
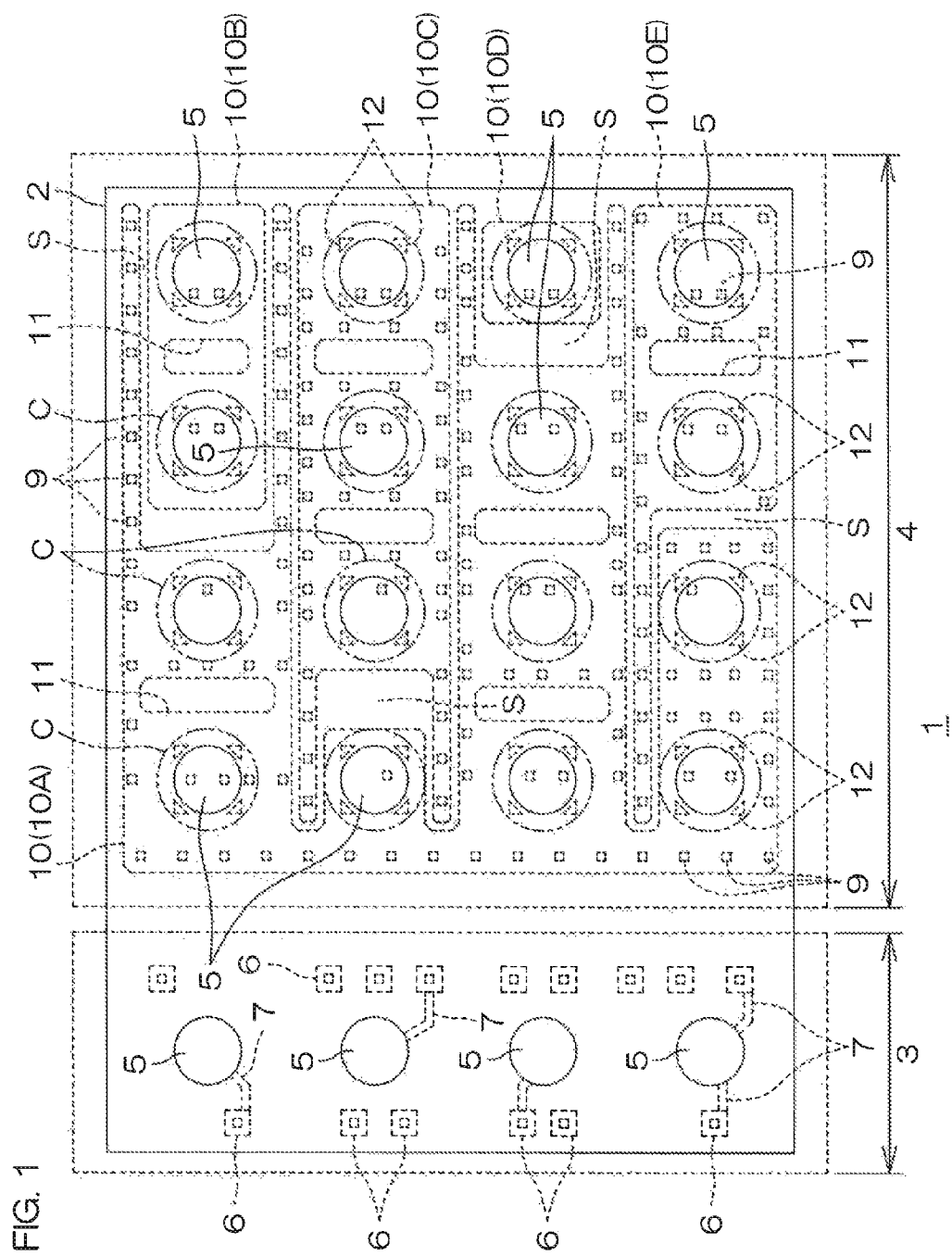
FIG. 1 is a schematic plan view of a semiconductor device according to a preferred embodiment of the present invention.

A semiconductor device to achieve the above-described object includes a semiconductor substrate, a pad formed on the semiconductor substrate, a rewiring that is electrically connected to the pad and led to a region outside the pad, a resin layer formed on the rewiring, and an external terminal electrically connected to the rewiring via the resin layer, and the resin layer is formed so as to enter the inside of a slit formed in a region along the periphery of the external terminal in the rewiring.

In a semiconductor device having a CSP (Chip Size Package) structure, a structure in which from a pad formed on a semiconductor substrate, rewiring is further led to a region outside the pad, has been proposed. In the case where a rewiring is formed, a resin layer is formed to cover the rewiring. An external terminal is connected to the rewiring via the resin layer.

Here, when heat is applied to the semiconductor device, this heat is transmitted to the rewiring and the resin layer which have thermal expansion coefficients different from each other. A volume shrinkage rate of the rewiring when cooling is different from that of the resin layer. Therefore, when cooling, a stress is generated in the rewiring, and as a result, the resin layer may peel from the rewiring. This problem easily occurs especially at the periphery of the external terminal that is easily influenced by heat.

With the arrangement of the present invention, in a region along the periphery of the external terminal in the rewiring, a slit is formed. The resin layer formed on the rewiring is formed so as to enter the inside of the slit. Accordingly, adhesion between the rewiring and the resin layer is increased. That is, an anchor effect can be obtained by the resin layer entering the inside of the slit. Accordingly, peeling of the resin layer can be suppressed.

In the semiconductor device described above, it is preferable that the rewiring in common is formed to cover a plurality of the pads.

With the arrangement of the present invention, a thick wiring as a rewiring in common is formed to cover a plurality of pads. Here, in the case where a rewiring (thick wiring) having no slit is formed, although the resin layer has a comparatively large contact area with the rewiring, the adhesion between the resin layer and the rewiring is not so high as to suppress peeling of the resin layer. Therefore, due to a stress generated in the rewiring, the resin layer may peel from the rewiring in a wide range.

On the other hand, with the arrangement of the present invention, even when a thick wiring is formed, an anchor effect can be obtained by the resin layer entering the inside of the slit, and therefore, peeling of the resin layer can be suppressed. In addition, the area of the rewiring can be enlarged, so that in a case where a comparatively large current is flowed, an increase in resistance value in the rewiring can be suppressed. Accordingly, while peeling of the resin layer is suppressed, reduction in resistance can be realized.

In the semiconductor device described above, in the resin layer, an opening to expose the rewiring is formed, and the external terminal is connected to the rewiring via the opening.

A stress generated in the rewiring is easily concentrated especially in the opening end of the opening formed in the resin layer, and this causes a crack (cracking) at the opening end.

With the arrangement of the present invention, since a slit is formed around the opening of the resin layer on which the external terminal is formed, a stress generated in the rewiring can be relaxed by the slit. Accordingly, occurrence of a crack at the opening end of the opening formed in the resin layer can be suppressed. As a result, a connection failure of the external terminal, etc., can be suppressed.

In the semiconductor device described above, in a case where the size of the external terminal in planar view is defined as 100%, the slit is preferably formed in a region of 150% or less with respect to the size of the external terminal in planar view.

In the semiconductor device described above, it is preferable that the external terminal is circular in planar view, and in the region of 150% or less, when a quadrangle that houses the external terminal is drawn, the slit is formed between a peripheral edge portion of the external terminal and a peripheral edge portion of the quadrangle.

The semiconductor device described above preferably includes a plurality of the slits. With this arrangement, a resin layer is formed to enter the plurality of slits. Accordingly, the anchor effect can be further increased by the resin layer entering the plurality of slits, so that the adhesion between the rewiring and the resin layer can be further increased. As a result, peeling of the resin layer can be effectively suppressed.

In the semiconductor device described above, the slit may include a slit being triangular in planar view, or a slit being rectangular in planar view. In the semiconductor device described above, the rewiring may include copper wiring, and the resin layer may include a polyimide layer.

In the semiconductor device described above, the slit preferably has a width of 15 µm or more.

A manufacturing method for a semiconductor device to achieve the above-described object includes a step of forming a pad on a semiconductor substrate, a step of forming a rewiring that is electrically connected to the pad and led to a region outside the pad, a step of forming a resin layer on the rewiring, and a step of forming an external terminal so that the external terminal is electrically connected to the rewiring via the resin layer, wherein the step of forming the rewiring includes a step of forming a slit in a region along the periphery of the external terminal in the rewiring, and the resin layer is formed so as to enter the inside of the slit.

According to this method, in a region along the periphery of the external terminal in the rewiring, a slit is formed. The resin layer that is formed on the rewiring is formed so as to enter the inside of the slit. Accordingly, adhesion between the rewiring and the resin layer is increased. That is, by the resin layer entering the inside of the slit, an anchor effect can be obtained. As a result, a semiconductor device in which peeling of the resin layer can be suppressed can be provided.

In the manufacturing method for a semiconductor device described above, it is preferable that the rewiring in common is formed to cover a plurality of the pads. According to this method, a thick wiring is formed as a rewiring in common to cover a plurality of pads. Even in the case where the thick wiring is formed, an anchor effect can be obtained by the resin layer entering the inside of the slit, so that peeling of the resin layer can be suppressed. In addition, the area of the rewiring can be enlarged, so that in a case where a comparatively large current is flowed, an increase in resistance value in the rewiring can be suppressed. Accordingly, a semiconductor device in which while peeling of the resin layer is suppressed, reduction in resistance can be realized, can be provided.

The manufacturing method for a semiconductor device described above preferably includes a step of forming an opening to selectively expose the rewiring in the resin layer, and the external terminal is formed so as to be electrically connected to the rewiring via the opening of the resin layer.

According to this method, a slit is formed in the periphery of the opening of the resin layer on which the external terminal is formed, so that a stress generated in the rewiring can be relaxed by the slit. Accordingly, occurrence of a crack at the opening end of the opening formed in the resin layer can be suppressed. As a result, a semiconductor device in which a connection failure of the external terminal, etc., can be suppressed can be provided.

In the manufacturing method for a semiconductor device described above, in a case where the size of the external terminal in planar view is defined as 100%, the slit is preferably formed in a region of 150% or less with respect to the size of the external terminal in planar view.

In the manufacturing method for a semiconductor device described above, it is preferable that the external terminal is formed to be circular in planar view, and in the region of 150% or less, when a quadrangle that houses the external terminal is drawn, the slit is formed between a peripheral edge portion of the external terminal and a peripheral edge portion of the quadrangle.

In the manufacturing method for a semiconductor device described above, it is preferable that a plurality of the slits are formed. According to this method, the anchor effect can be further improved by the resin layer entering the plurality of slits, so that adhesion between the rewiring and the resin layer can be further increased. As a result, a semiconductor device in which peeling of the resin layer can be effectively suppressed can be provided.

In the manufacturing method for a semiconductor device described above, the step of forming the rewiring preferably includes a step of forming a mask including a slit mask that selectively covers a region in which the slit should be formed and has a width of 15 µm or more, and a step of forming the rewiring having the slit by depositing a conductive material via the mask.

If the width of the slit mask is excessively narrow at the time of mask formation, the slit mask may collapse. Therefore, as in the method according to the present invention, by setting the width of the slit mask to 15 µm or more, collapse of the slit mask can be effectively suppressed. Accordingly, the rewiring having the slit can be reliably formed.

In the manufacturing method for a semiconductor device described above, the rewiring including copper wiring may be formed, and the resin layer including a polyimide layer may be formed.

Hereinafter, a preferred embodiment of the present invention is described in detail with reference to the accompanying drawings.

FIG. 1 is a schematic plan view of a semiconductor device 1 according to a preferred embodiment of the present invention.

The semiconductor device 1 has a CSP (Chip Size Package) structure including, for example, SSI (Small Scale Integration), LSI (Large Scale Integration), MSI (Medium Scale Integration), VLSI (Very Large Scale Integration), VLSI (Ultra-Very Large Scale Integration), etc.

As shown in FIG. 1, the semiconductor device 1 includes a semiconductor substrate 2 that has a substantially rectangular shape in planar view (in the present preferred embodiment, a substantially oblong shape in planar view). The semiconductor substrate 2 may be, for example, a silicon substrate. On the semiconductor substrate 2, a logic circuit region 3 in which a logic circuit is formed, and a power control region 4 in which an integrated circuit to which comparatively high power is supplied is formed, are set.

In the logic circuit region 3 and the power control region 4, pluralities of external terminals 5 are regularly arrayed.

Each external terminal 5 is exposed to the outermost surface of the semiconductor substrate 2, and constitutes a connection terminal to realize electrical connection to a connecting target (for example, PCB: Printed-Circuit-Board). The external terminals 5 may be solder balls.

The logic circuit region 3 is set on the one-end portion side (left end portion of the sheet) of the semiconductor substrate 2. In the logic circuit region 3, a plurality (four in the present preferred embodiment) of external terminals 5 are disposed along the short direction of the semiconductor substrate 2. Around each external terminal 5, a plurality of input pads 6 (refer to the dashed lines in FIG. 1) that are substantially rectangular in planar view are formed.

Each input pad 6 is electrically connected to the logic circuit. Each input pad 6 is electrically connected to the external terminal 5 via rewiring 7 (refer to the dashed line in FIG. 1). The rewirings 7 connect the input pads 6 and the external terminals 5 one-to-one, respectively. Each rewiring 7 has a width smaller than that of the external terminal 5. As shown in FIG. 1, all of the input pads 6 do not necessarily have to be connected to each external terminal 5 via the rewirings 7, and a portion of the input pads may be connected to the external terminal 5. Powers that are input into the respective external terminals 5 are supplied to the logic circuit via the rewirings 7 and the input pads 6.

On the other hand, the power control region 4 is spaced from the logic circuit region 3 so as to be electrically separated. In the power control region 4, a plurality of external terminals 5 are arranged in a square matrix (a matrix of four rows and four columns in the present preferred embodiment) along the longitudinal direction and the short direction of the semiconductor substrate 2. The plurality of external terminals 5 may be arranged in zigzag in the row direction and the column direction by displacing the position of every other external terminal in the row direction. In the power control region 4, a plurality of electrode pads 9 (refer to the dashed lines in FIG. 1) having substantially rectangular shapes in planar view are formed.

Each electrode pad 9 is electrically connected to the integrated circuit. The electrode pads 9 are formed both inside and outside the regions in which the external terminals 5 are formed in planar view. The electrode pads 9 are electrically connected to the external terminals 5 via the rewiring 10 (refer to the dashed lines in FIG. 1).

The rewiring 10 is led to the outsides of the regions in which the electrode pads 9 are formed. As shown in FIG. 1, in planar view, the rewiring 10 includes a thick wiring pattern that surrounds each external terminal 5 with an area larger than the area of the external terminal 5. The rewiring 10 also includes a linear pattern continuously extending in the row direction and/or the column direction along a plurality of external terminals 5. The linear pattern may be across a plurality of external terminals 5. Further, the rewiring 10 includes a pattern that is a combination of a thick wiring pattern and a linear pattern.

The present preferred embodiment shows an example in which the rewiring 10 includes a plurality of rewirings 10A, 10B, 10C, 10D, and 10E. To the rewiring 10A, eight external terminals 5 are connected. To the rewiring 10B, two external terminals 5 are connected. To the rewiring 10C, three external terminals 5 are connected. To the rewiring 10D, one external terminal 5 is connected. To the rewiring 10E, two external terminals 5 are connected. A plurality of electrode pads 9 are collectively covered by the rewirings 10A to 10E in common.

The rewirings 10A to 10E are formed at intervals by sandwiching spaces S therebetween so as to be electrically separated from each other. That is, the rewirings 10A to 10E form groups into which powers different from each other are input, respectively. One or a plurality of external terminals 5 belonging to the same group form the same potential with the corresponding rewiring of the rewirings 10A to 10E. Powers input into the respective external terminals 5 are input into the integrated circuit via the respective rewirings 10A to 10E and the electrode pads 9.

In the rewiring 10, removed portions 11 in which portions of the rewiring 10 are removed may be formed (refer to the dashed lines in FIG. 1). The removed portion 11 is selectively formed in a region between external terminal forming regions C (refer to the alternate long and two short dashes lines in FIG. 1) each surrounding the external terminal 5. The external terminal forming regions C are described later. The removed portion 11 is an island-shaped region the periphery of which is closed by being surrounded by the rewiring material of the rewiring 10. The removed portion 11 has an area larger than that of the electrode pad 9 in planar view, and is formed in a region in which the rewiring 10 does not face the electrode pad 9. The removed portion 11 may have, for example, a longitudinal shape with a width of 25 μm to 500 μm. In the present preferred embodiment, an example of the removed portion 11 formed to extend longitudinally along the column direction is shown. A portion of the removed portion 11 may cross the region between the peripheral edge portion of the external terminal 5 and the external terminal forming region C in planar view.

Figure 2:
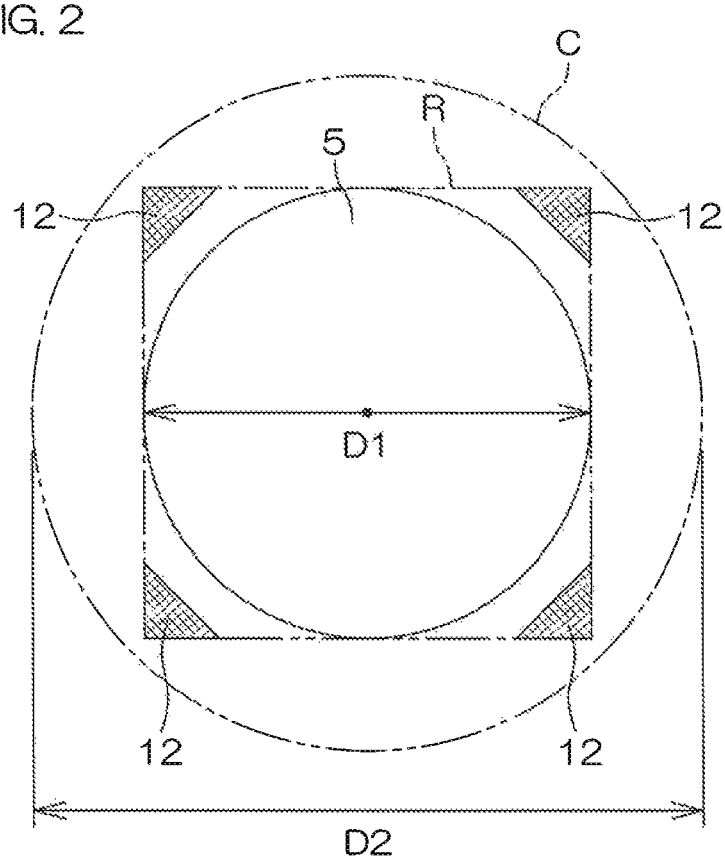
FIG. 2 is a schematic plan view for describing disposition of slits.
Figure 3A:
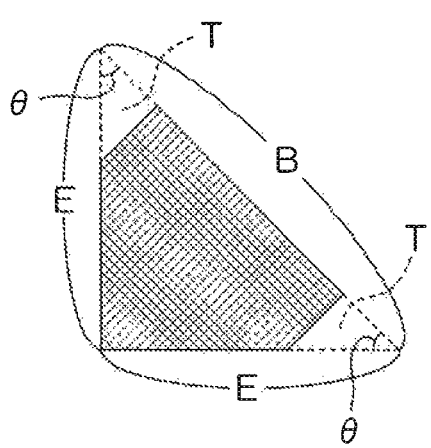
FIGS. 3A and 3B are schematic plan views for describing shapes of the slits.
Figure 3B:
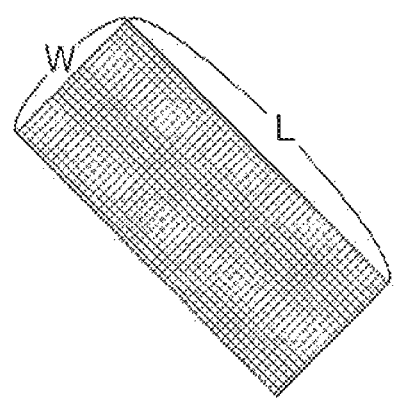

In the rewiring 10, a plurality of slits 12 are formed in a region along the periphery of the external terminal 5. Each slit 12 is formed inside the external terminal forming region C. Each slit 12 is an island-shaped region in which the rewiring 10 is removed and the periphery of which is closed by being surrounded by the rewiring material of the rewiring 10. Each slit 12 is formed in the region between the peripheral edge portion of the external terminal 5 and the removed portion 11, and has an area smaller than the area of the removed portion 11 in planar view. Referring to FIG. 2 and FIGS. 3A and 3B, the disposition and the shapes of the slits 12 are described in detail.

FIG. 2 is a schematic plan view for describing the disposition of the slits 12. FIGS. 3A and 3B are schematic plan views for describing examples of the shapes of the slits 12. In FIG. 2, the planar shape of the external terminal 5 is shown by a solid line, and the portion at which the slit 12 is formed is shown by cross hatching.

In a case where the size of the planar shape of the external terminal 5 is defined as 100%, the external terminal forming region C is a circular region with a size of 150% with respect to the planar shape of the external terminal 5. Each slit 12 is formed in the region of 150% or less with respect to the planar shape of the external terminal 5. In greater detail, as shown in FIG. 2, each slit 12 is formed in a region between the peripheral edge portion of the external terminal 5 and the external terminal forming region C in planar view. The diameter D1 of the external terminal 5 may be, for example, 200 μm to 300 μm (270 μm in the present preferred embodiment). The diameter D2 of the external terminal forming region C may be, for example, 300 μm to 450 μm (405 μm in the present preferred embodiment).

In the plan view shown in FIG. 2, in a case where a quadrangle R in which the external terminal 5 is housed is drawn inside the external terminal forming region C, each slit 12 is formed between the peripheral edge portion of the external terminal 5 and the peripheral edge portion of the quadrangle R. The quadrangle R may be a square. That is, in the case where a quadrangle R in contact with the peripheral edge portion of the external terminal 5 is drawn, each slit 12 may be disposed inside a circular region with a diameter $2^{1/2}$ times as large as the diameter D1 (a region of 142% or less with respect to the planar shape of the external terminal 5). The respective slits 12 may be formed at four corners of this quadrangle R. Each slit 12 may include a slit that is triangular in planar view and formed at any of the four corners of the quadrangle R. In this case, each side of each slit 12 preferably has a width of 15 µm or more.

Each slit 12 may include, as shown in FIG. 3A, a slit that has a shape of a right triangle in planar view. In this case, each slit 12 may include a slit that has a shape of an isosceles right triangle with a base B of 25 µm to 50 µm and equal sides E of 17 µm to 36 µm. Each slit 12 may have an arrangement in which regions T being triangular in planar view including portions of the base B and equal sides E forming the base angles θ are removed. The regions T may be isosceles triangles with equal sides of approximately 5 µm.

As shown in FIG. 3B, each slit 12 may include a slit substantially rectangular in planar view. In this case, each slit 12 may include a slit having a shape substantially rectangular in planar view having a width W of 15 µm or more and a length L of 15 µm to 30 µm. Of course, each slit may include a slit square in planar view having a width W and a length L that are equal to each other (15 µm or more).

Figure 4:
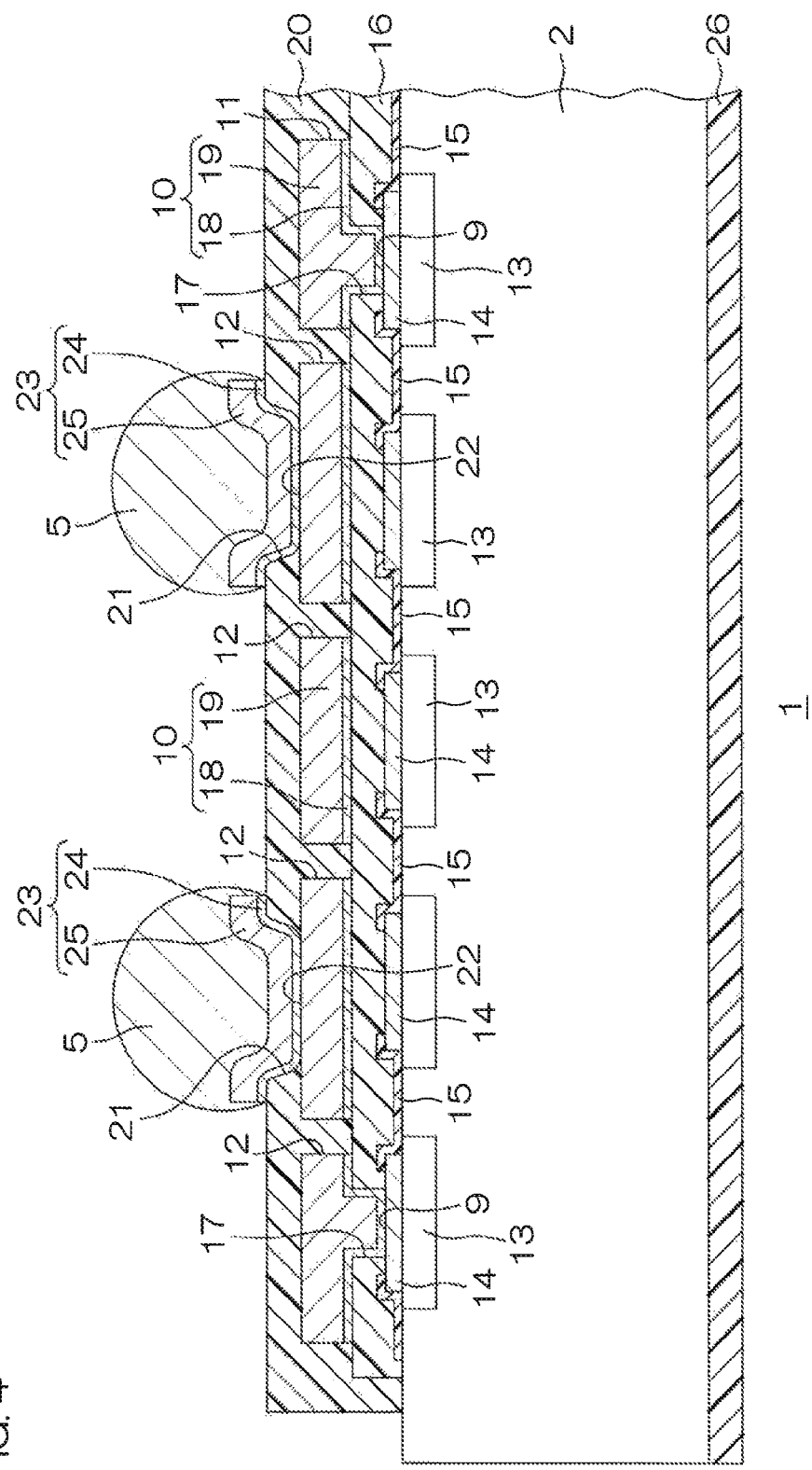
FIG. 4 is a schematic sectional view for describing a sectional structure of a power control region relating to the semiconductor device shown in FIG. 1.
Figure 5:
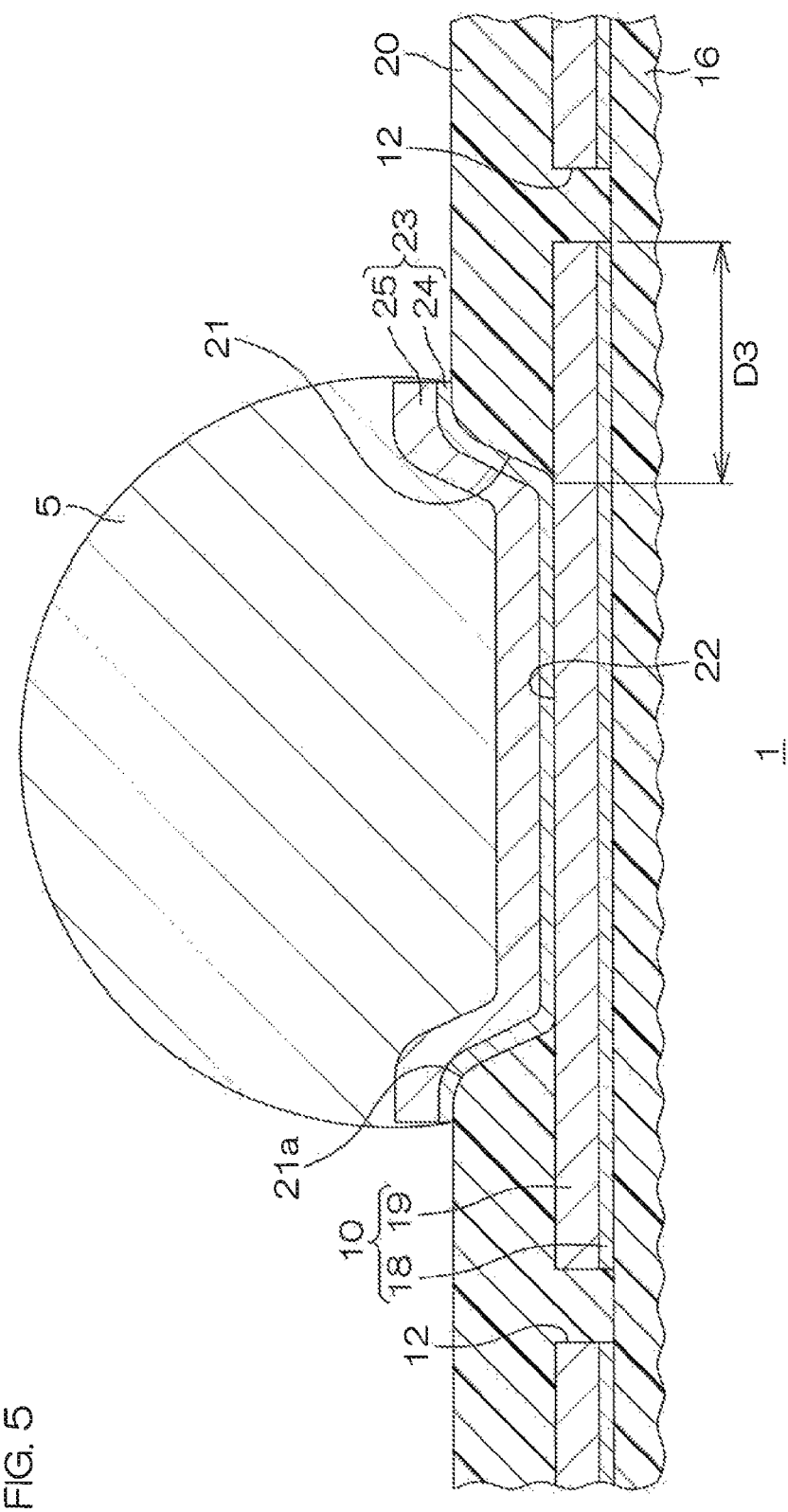
FIG. 5 is a partial enlarged sectional view of the power control region shown in FIG. 4.

FIG. 4 is a schematic sectional view for describing a sectional structure of the power control region 4 relating to the semiconductor device 1 shown in FIG. 1. FIG. 5 is a partial enlarged sectional view of the power control region 4 shown in FIG. 4.

As shown in FIG. 4, in the front surface portion of the semiconductor substrate 2, impurity regions 13 constituting portions of LSI, etc., are selectively formed. The present preferred embodiment shows an example in which a plurality of impurity regions 13 are formed so as to be spaced from each other, however, the impurity regions 13 may be formed integrally and continuously with each other.

On each impurity region 13, an electrode film 14 is formed so as to be electrically connected to the corresponding impurity region 13. A conductive material of the electrode film 14 is, for example, aluminum (Al), copper (Cu), or an alloy of these (AlCu) (aluminum in the present preferred embodiment). On the semiconductor substrate 2, a passivation film 15 is formed.

The passivation film 15 is formed so as to cover the peripheral edge portions of the electrode films 14 and expose portions of the electrode films 14. Accordingly, portions of the electrode films 14 are exposed from the passivation film 15. The passivation film 15 is made of, for example, an insulating material such as silicon oxide ($SiO_2$) or silicon nitride (SiN). On the passivation film 15, a first resin layer 16 is formed.

The first resin layer 16 may be made of, for example, a photosensitive resin. In detail, the first resin layer 16 may be made of a polyimide resin, a polybenzoxasole resin, an epoxy resin, a phenol resin, or the like.

The first resin layer 16 has pad openings 17 that expose portions of the electrode films 14 as electrode pads 9. The pad openings 17 are formed to have substantially rectangular shapes in planar view. Accordingly, electrode pads 9 having substantially rectangular shapes in planar view are formed (refer to FIG. 1 as well). As shown in FIG. 4, the pad openings 17 do not necessarily have to be formed for all electrode films 14, and a plurality of electrode films 14 may be covered by the first resin layer 16. In the sectional view shown in FIG. 4, the plurality of electrode films 14 covered by the first resin layer 16 may constitute the electrode pads 9 in other regions. On the electrode pads 9, a rewiring 10 led onto the first resin layer 16 is formed.

The rewiring 10 is formed so as to enter the insides of the pad openings 17 from the front surface of the first resin layer 16. The rewiring 10 is electrically connected to the electrode pads 9 inside the pad openings 17. As shown in FIG. 4 and FIG. 5, in the present preferred embodiment, the rewiring 10 is a rewiring layer including a UBM (under bump metal) film 18 and a wiring film 19 formed on the UBM film 18.

The UBM film 18 is formed so that the front surface and the rear surface (surface on the semiconductor substrate 2 side) thereof are along the front surface of the first resin layer 16, the inner surfaces of the pad openings 17, and the front surfaces of the electrode pads 9. The UBM film 18 is electrically connected to the electrode pads 9 inside the pad openings 17. The UBM film 18 may have a two-layer structure made of different conductive materials. In this case, the UBM film 18 may include a titanium (Ti) film and a copper film formed on the titanium film.

The wiring film 19 is formed along the front surface of the UBM film 18 so as to enter the concave spaces formed by making the UBM film 18 enter the insides of the pad openings 17. The wiring film 19 is electrically connected to the electrode pads 9 via the UBM film 18. The content rate of the wiring film 19 with respect to the rewiring 10 is preferably larger than the content rate of the UBM film 18 with respect to the rewiring 10. The wiring film 19 is preferably formed to be thicker than the UBM film 18. The wiring film 19 may be a copper wiring film or an aluminum wiring film (a copper wiring film in the present preferred embodiment).

In the rewiring 10, a removed portion 11 that exposes the front surface of the first resin layer 16 is formed (refer to FIG. 1 as well). In the region along the periphery of the external terminal 5 in the rewiring 10, a plurality of slits 12 are formed (refer to FIG. 1 as well). From the removed portion 11 and the respective slits 12, the front surface of the first resin layer 16 is exposed. A second resin layer 20 is formed so as to cover the rewiring 10.

The second resin layer 20 may be made of, for example, a photosensitive resin. In detail, the second resin layer 20 may be made of a polyimide resin, a polybenzoxasole resin, an epoxy resin, a phenol resin, or the like. The second resin layer 20 is preferably made of the same material as that of the first resin layer 16.

The second resin layer 20 is formed so as to enter the insides of the removed portion 11 and the respective slits 12 formed in the rewiring 10, and backfill the removed portion 11 and the respective slits 12. The second resin layer 20 is in contact with the front surface of the first resin layer 16 inside the removed portion 11 and the respective slits 12. The second resin layer 20 is preferably in close contact with the first resin layer 16 inside the removed portion 11 and the respective slits 12.

The second resin layer 20 includes rewiring pad openings 21 that expose portions of the rewiring 10 as rewiring pads 22. The rewiring pad openings 21 may be substantially rectangular in planar view, or may be substantially circular in planar view.

Referring to FIG. 4 and FIG. 5, the rewiring pad opening 21 has a curved opening end 21a outward of the second resin layer 20. In the region along the periphery of the rewiring pad opening 21, each slit 12 is disposed. The shortest distance D3 between the rewiring pad 22 (rewiring pad opening 21 of the second resin layer 20) and each slit 12 is preferably 15 µm to 50 µm. On the rewiring pad 22, an electrode post 23 projecting from the front surface of the second resin layer 20 is formed.

The electrode post 23 is formed so as to enter the inside of the rewiring pad opening 21 from the front surface of the second resin layer 20. The peripheral edge portion of the electrode post 23 is positioned in a region between the rewiring pad opening 21 of the second resin layer 20 and each slit 12. The electrode post 23 is electrically connected to the rewiring pad 22 inside the rewiring pad opening 21. The electrode post 23 may be formed to be substantially circular shape in planar view. The electrode post 23 includes a UBM film 24 and a wiring film 25 formed on the UBM film 24.

The UBM film 24 is formed so that the front surface and the rear surface (surface on the semiconductor substrate 2 side) thereof are along the front surface of the second resin layer 20, the inner surface of the rewiring pad opening 21, and the front surface of the rewiring pad 22. The UBM film 24 is electrically connected to the rewiring pad 22 inside the rewiring pad opening 21. The UBM film 24 may have a two-layer structure made of different conductive materials. In this case, the UBM film 24 may include a titanium film and a copper film formed on the titanium film.

The wiring film 25 is formed along the front surface of the UBM film 24 so as to enter a concave space formed by making the UBM film 24 enter the inside of the rewiring pad opening 21. The wiring film 25 is electrically connected to the rewiring pad 22 via the UBM film 24. The wiring film 25 may be a copper wiring film or an aluminum wiring film (a copper wiring film in the present preferred embodiment).

The external terminal 5 is formed on the electrode post 23, and is exposed to the outermost surface of the semiconductor substrate 2. The external terminal 5 may be formed so as to cover portions of side portions of the electrode post 23 exposed from the second resin layer 20, or as shown in FIG. 4 and FIG. 5, may be formed so as to cover the entireties of the side portions of the electrode post 23. The external terminal 5 may be in contact with the second resin layer 20 in a region outside the electrode post 23.

On the rear surface (surface on the side opposite to the side on which the external terminals 5 are formed) of the semiconductor substrate 2, a back coat layer 26 is formed. The back coat layer 26 is formed so as to cover the rear surface of the semiconductor substrate 2. The back coat layer 26 may include, for example, an inorganic filler including at least one kind selected from a group consisting of $Al_2O_3$, $SiO_2$, $ZrO_2$, $TiO_2$, SiC, MgO, zeolite, AlN, and BN. In addition, the back coat layer 26 may include, for example, an organic filler such as silicone rubber.

The input pad 6 in the logic circuit region 3 has the same arrangement as that of the electrode pad 9 in the power control region 4. The rewiring 7 in the logic circuit region 3 has the same arrangement as that of the rewiring 10 in the power control region 4. The other major arrangement of the logic circuit region 3 is the same as that of the power control region 4, and therefore, will not be described.

FIG. 6A to FIG. 6K are sectional views for describing examples of the steps of manufacturing the semiconductor device 1 shown in FIG. 1, corresponding to FIG. 4.

First, as shown in FIG. 6A, a semiconductor substrate 2 in which LSI, etc., are formed is prepared. In FIG. 6A, only impurity regions 13 constituting portions of LSI, etc., are shown. Next, electrode films 14 that selectively cover the regions in which the impurity regions 13 are formed are formed.

Next, as shown in FIG. 6B, by CVD (Chemical Vapor Deposition), by depositing silicon nitride so as to cover the electrode films 14, the passivation film 15 is formed. Next, unnecessary portions of the passivation film 15 are etched so that portions of the electrode films 14 are exposed from the passivation film 15.

Next, as shown in FIG. 6C, by applying photosensitive polyimide or the like, the first resin layer 16 is formed. Next, the first resin layer 16 is exposed in a pattern corresponding to the pad openings 17. Next, the first resin layer 16 is developed. Accordingly, pad openings 17 that expose portions of the electrode films 14 as electrode pads 9 are formed in the first resin layer 16. After development, heat treatment to cure the first resin layer 16 may be performed as necessary.

Figure 6D:
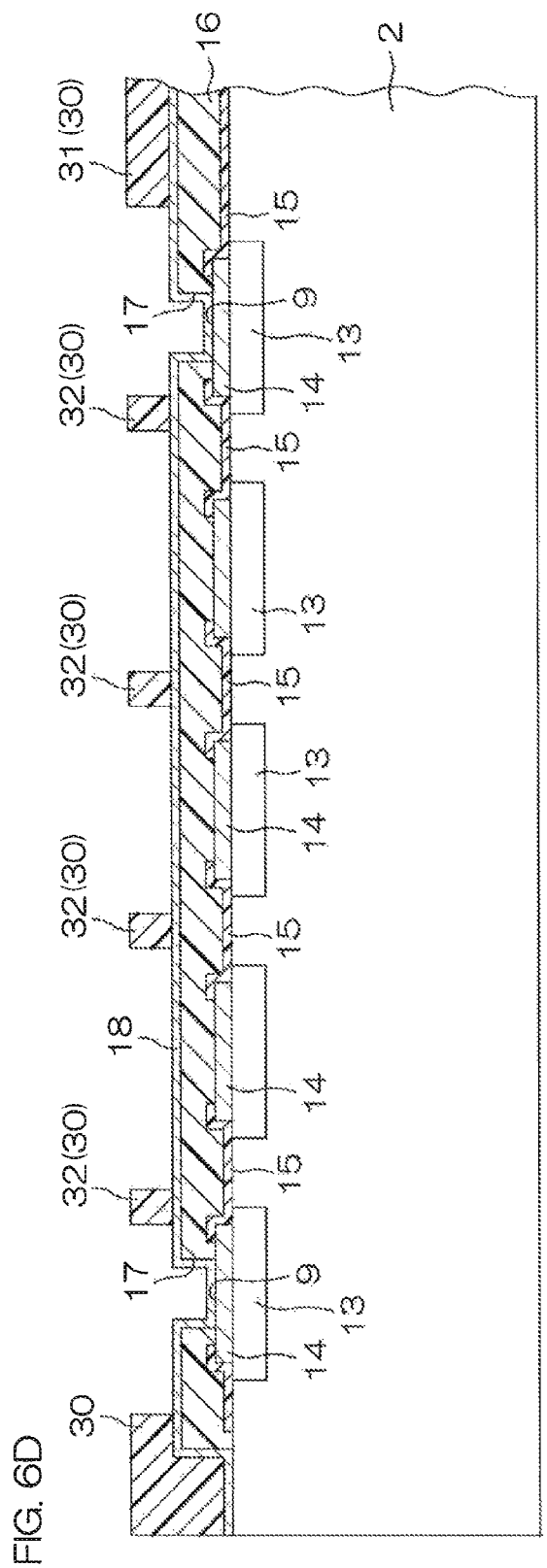

Next, as shown in FIG. 6D, the UBM film 18 is formed along the first resin layer 16, the inner surfaces of the pad openings 17, and the front surfaces of the electrode pads 9. The UBM film 18 is formed by, for example, depositing a titanium film and a copper film in order by sputtering.

Next, on the UBM film 18, a resist mask 30 is formed. Next, the resist mask 30 is exposed so that regions corresponding to the final shape of the rewiring 10 (planar shapes of the rewirings 10A to 10E) are selectively exposed. Next, the resist mask 30 is developed. Accordingly, the regions corresponding to the final shape of the rewiring 10 (planar shapes of the rewirings 10A to 10E) are exposed from the resist mask 30. At this time, the resist mask 30 is formed so as to include a removed portion mask 31 that covers the region in which the removed portion 11 should be formed, and a slit mask 32 that covers the regions in which the plurality of slits 12 should be formed. The slit mask 32 is preferably formed so as to have a thickness of 15 μm to 50 μm and a width of 15 μm or more.

Here, if the width of the slit mask 32 is excessively narrow, this slit mask may collapse. Therefore, by forming the slit mask 32 with a width of 15 μm or more, the slit mask 32 can be effectively prevented from collapsing. Accordingly, the slits 12 can be reliably formed in the rewiring 10.

Next, as shown in FIG. 6E, on the UBM film 18 exposed from the resist mask 30, for example, copper is deposited by plating. Accordingly, a wiring film 19 is formed on the UBM film 18. After the wiring film 19 is formed, the resist mask 30 is removed.

Next, as shown in FIG. 6F, by wet etching using the wiring film 19 as an etching mask, unnecessary portions of the UBM film 18 are removed. Accordingly, the rewiring 10 (rewirings 10A to 10E) including the removed portion 11 and the respective slits 12 is formed.

Figure 6G:
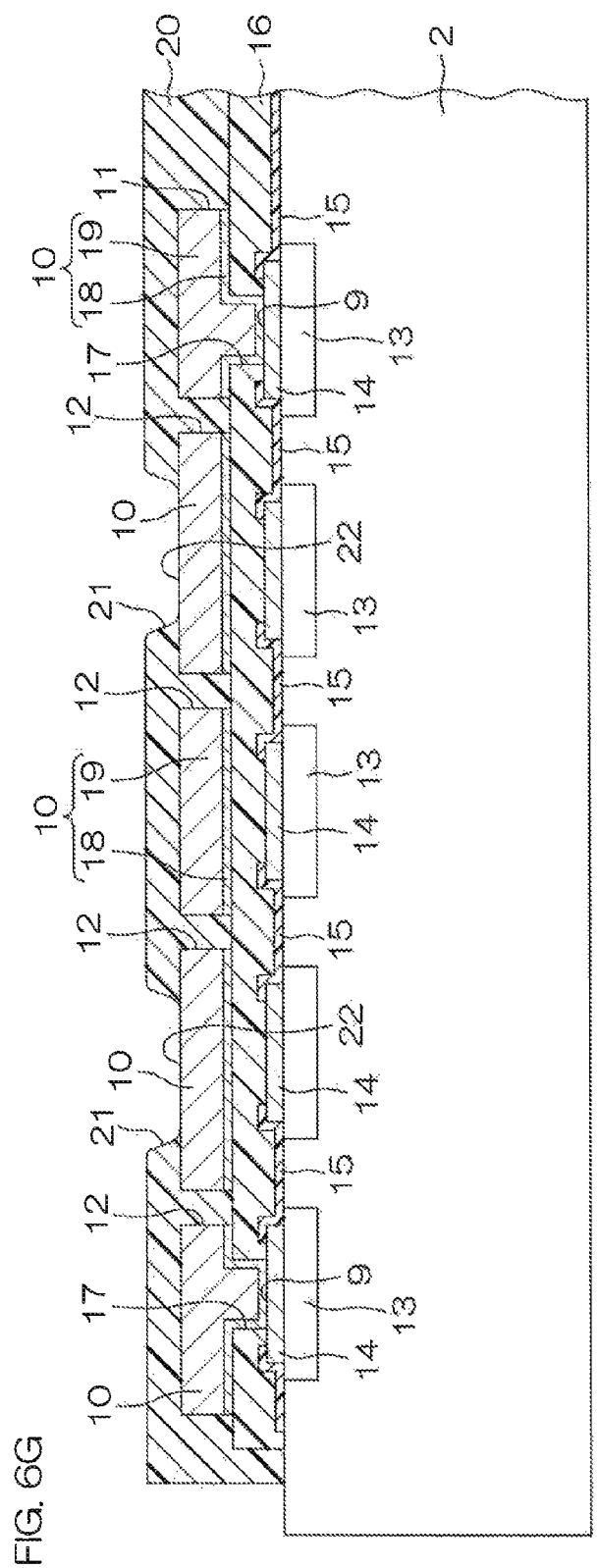

Next, as shown in FIG. 6G, by applying photosensitive polyimide or the like, the second resin layer 20 is formed. At this time, the second resin layer 20 is formed so as to enter the insides of the respective slits 12 formed in the rewiring 10 and backfill the respective slits 12. The second resin layer 20 is formed so as to contact with the front surface of the first resin layer 16 inside the respective slits 12. The second resin layer 20 is preferably formed so as to closely contact with the first resin layer 16 inside the respective slits 12.

Next, the second resin layer 20 is exposed in a pattern corresponding to the rewiring pad openings 21. Next, the second resin layer 20 is developed. Accordingly, in the second resin layer 20, rewiring pad openings 21 that expose portions of the rewiring 10 as rewiring pads 22 are formed. After development, heat treatment to cure the second resin layer 20 may be performed as necessary.

Figure 6H:
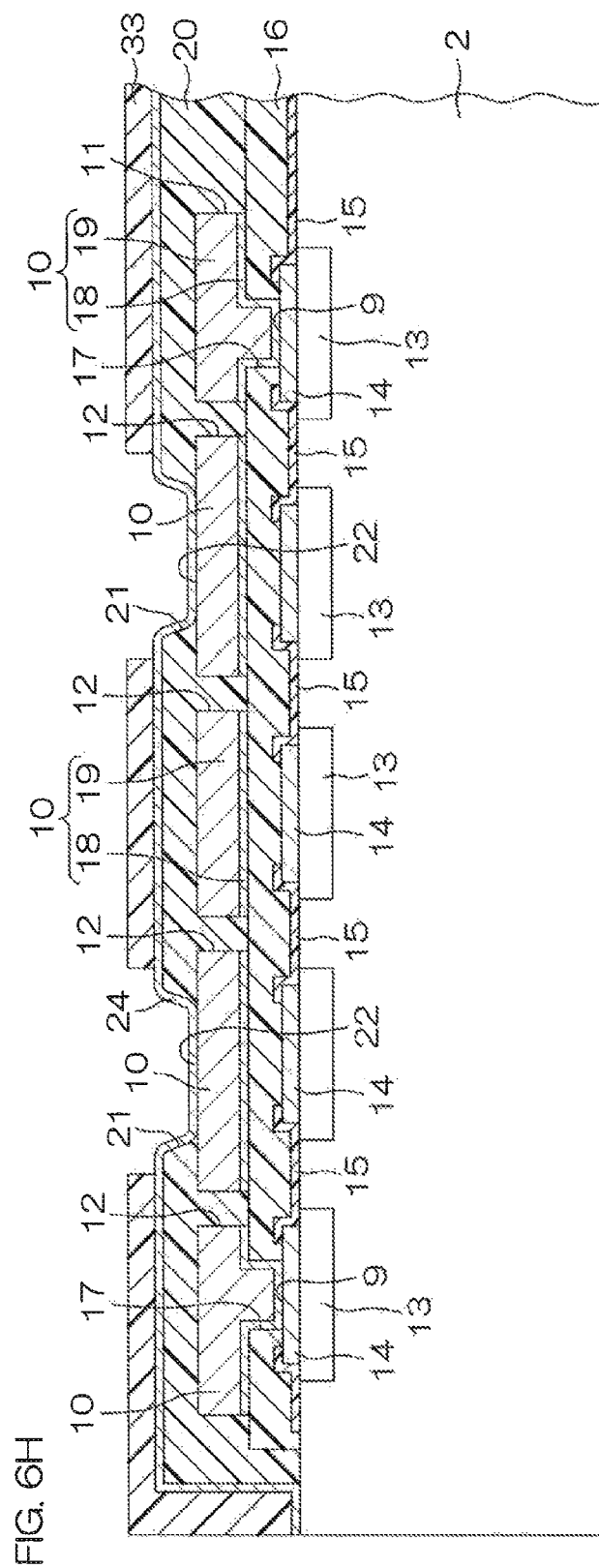

Next, as shown in FIG. 6H, the UBM film 24 is formed along the second resin layer 20, the inner surfaces of the rewiring pad openings 21, and the front surfaces of the rewiring pads 22. The UBM film 24 is formed by depositing a titanium film and a copper film in order by, for example, sputtering. Next, a resist mask 33 having openings that selectively expose regions in which the wiring films 25 (electrode posts 23) should be formed is formed on the UBM film 24.

Figure 6I:
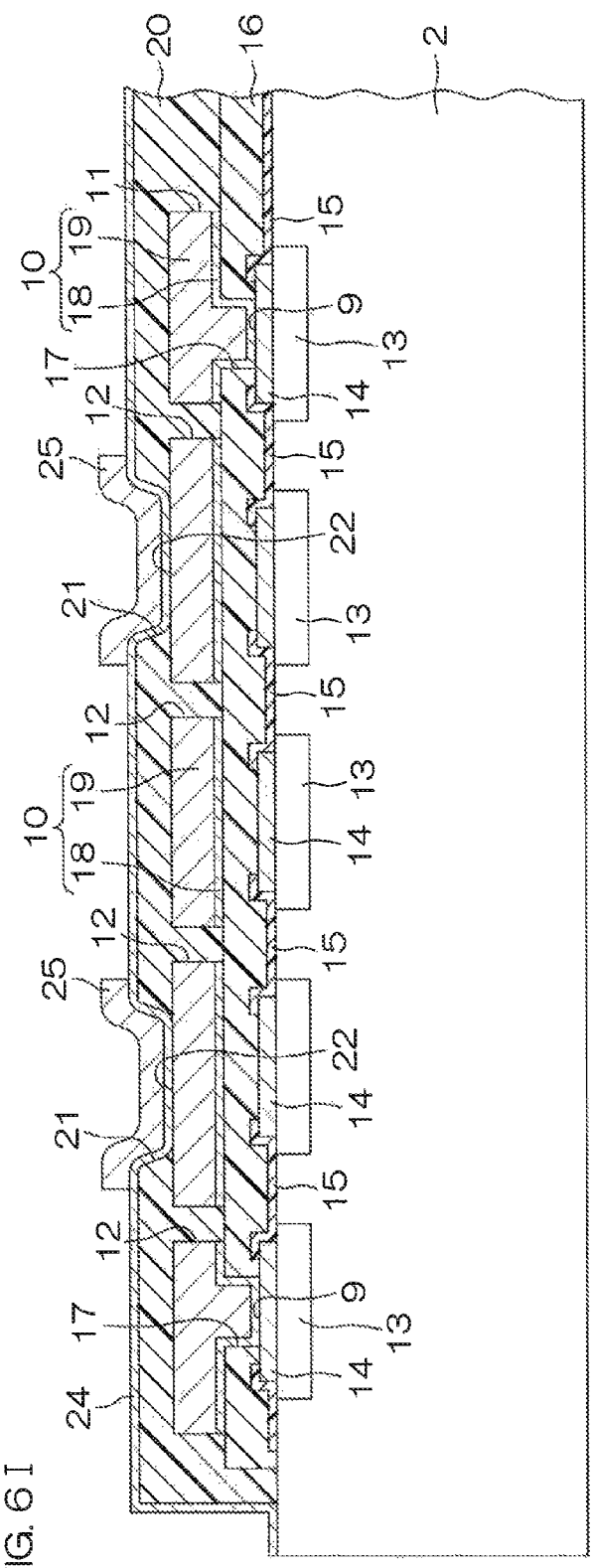
Figure 6J:
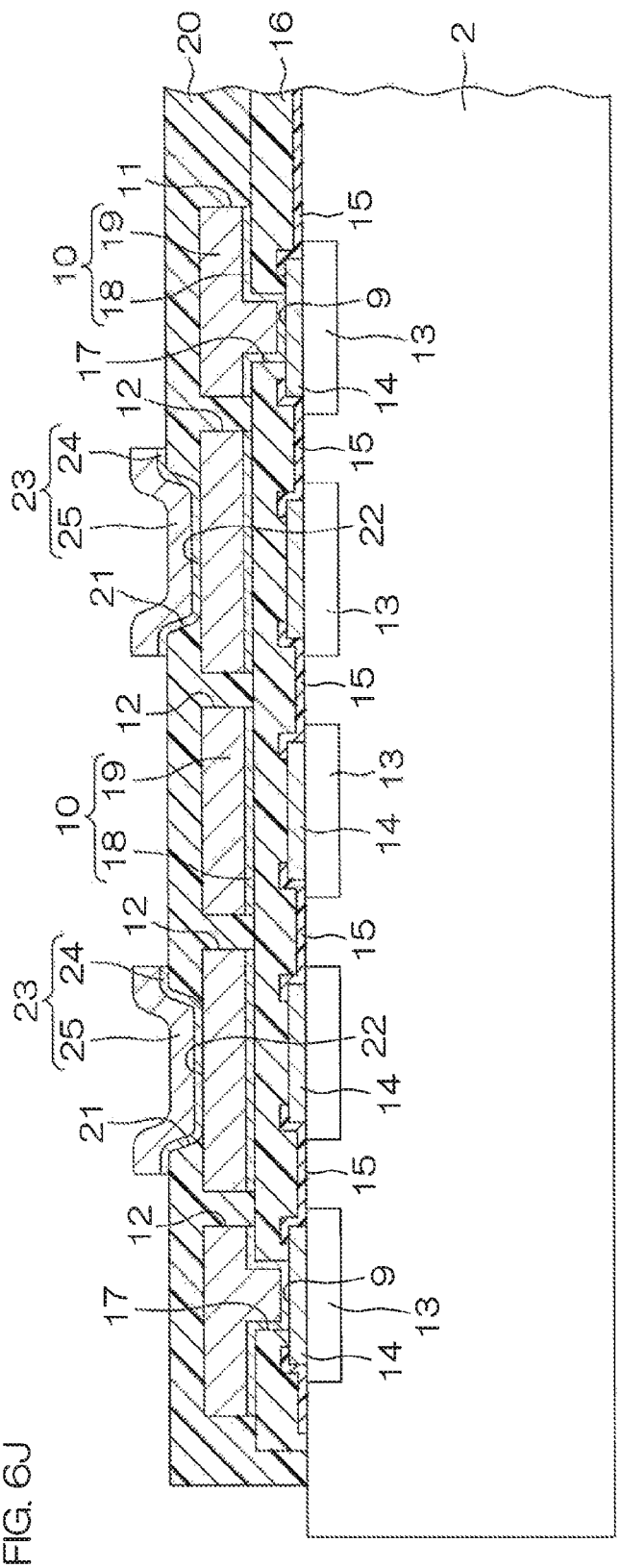

Next, as shown in FIG. 6I, on the UBM film 24 exposed from the resist mask 33, for example, copper is deposited by plating. Accordingly, the wiring films 25 are formed on the UBM film 24. Next, the resist mask 33 is removed. Next, as shown in FIG. 6J, by wet etching using the wiring films 25 as etching masks, unnecessary portions of the UBM film 24 are removed. Accordingly, the electrode posts 23 are formed from the second resin layer 20.

Figure 6K:
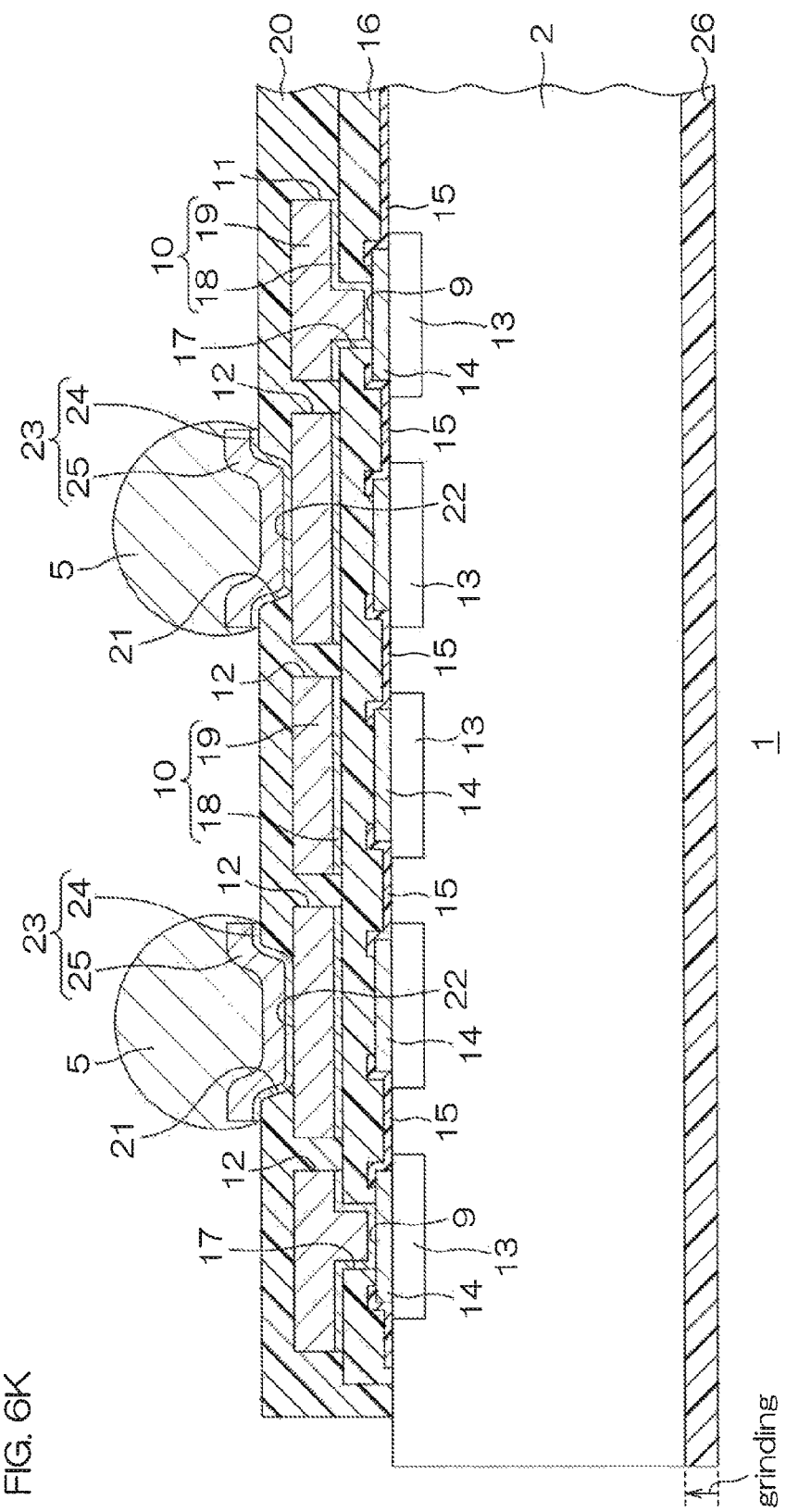

Next, as shown in FIG. 6K, the rear surface of the semiconductor substrate 2 is selectively ground. Next, on the rear surface of the semiconductor substrate 2, the back coat layer 26 made of an inorganic filler or an organic filler is formed. Next, external terminals 5 formed of solder balls are formed on the electrode posts 23. Through the above-described steps, the semiconductor device 1 is formed.

Figure 7:
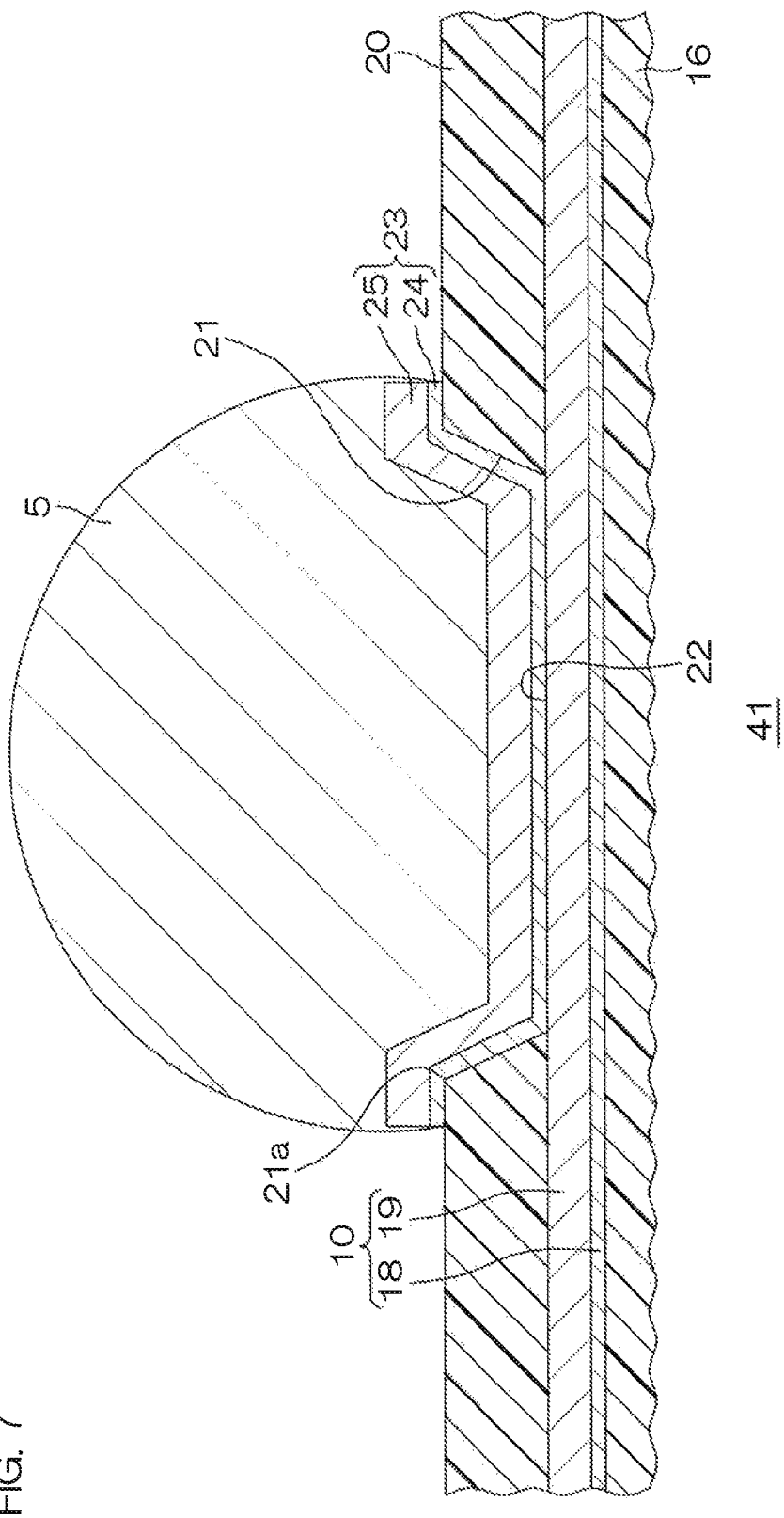
FIG. 7 is a sectional view for describing a structure of a semiconductor device relating to a reference example, corresponding to FIG. 5.

Next, an arrangement of a semiconductor device 41 according to a reference example is described with reference to FIG. 7. FIG. 7 is a sectional view for describing a structure of the semiconductor device 41 according to a reference example, corresponding to FIG. 5.

As shown in FIG. 7, the semiconductor device 41 according to the reference example is different from the semiconductor device 1 in that the slits 12 are not formed in the rewiring 10. In FIG. 7, components corresponding to those in FIG. 1 to FIG. 6K are designated by the same reference signs, and will not be described.

In the semiconductor device 41 according to the reference example, for example, the external terminals 5 are connected to a connecting target (for example, PCB) by being heated. In the semiconductor device 41 according to the reference example, the heat applied to the external terminals 5 is transmitted to the rewiring 10 and the second resin layer 20 which have different thermal expansion coefficients. The volume shrinkage rate of the rewiring 10 when cooling is different from that of the second resin layer 20. Therefore, when cooling, a stress is generated in the rewiring 10, and as a result, the second resin layer 20 may peel from the rewiring 10. This problem easily occurs especially around the external terminals 5 that are easily influenced by heat.

The semiconductor device 41 according to the reference example has an arrangement in which a plurality of electrode pads 9 are covered by a rewiring 10 (rewirings 10A to 10E (thick wirings) in common. Although the second resin layer 20 has a comparatively large contact area with the rewiring 10, adhesion between the second resin layer 20 and the rewiring 10 is not so high as to suppress peeling of the second resin layer 20. Therefore, due to a stress generated in the rewiring 10, the second resin layer 20 may peel from the rewiring 10 in a wide range.

A stress generated in the rewiring 10 is easily concentrated especially in the opening end 21a of the rewiring pad opening 21 formed in the second resin layer 20, and causes a crack (cracking) at the opening end 21a.

On the other hand, in the semiconductor device 1 according to the present invention, the rewiring 10 has the slit 12 in the region along the periphery of the external terminal 5. The second resin layer 20 formed on the rewiring 10 is formed so as to enter the inside of the slit 12. Accordingly, adhesion between the rewiring 10 and the second resin layer 20 is increased. That is, by the second resin layer 20 entering the inside of the slit 12, an anchor effect can be obtained. In addition, in the present preferred embodiment, a plurality of such slits 12 are formed. Therefore, the anchor effect can be further increased by the second resin layer 20 entering the plurality of slits 12. Accordingly, the adhesion between the rewiring 10 and the second resin layer 20 can be further increased, so that peeling of the second resin layer 20 can be effectively suppressed.

In addition, in the semiconductor device 1 according to the present invention, even in a case where a thick wiring (rewiring 10) is formed, peeling of the second resin layer 20 can be effectively suppressed by the anchor effect, so that the area of the rewiring 10 can be effectively enlarged. Accordingly, in a case where a comparatively large current is flowed, an increase in resistance value in the rewiring 10 can be suppressed. As a result, reduction in resistance can be realized while peeling of the second resin layer 20 is suppressed.

Further, in the semiconductor device 1 according to the present invention, a plurality of slits 12 are formed in the region along the periphery of the rewiring pad opening 21, the stress generated in the rewiring 10 can be relaxed by the respective slits 12. Accordingly, occurrence of a crack at the opening end 21a of the rewiring pad opening 21 formed in the second resin layer 20 can be effectively suppressed. As a result, a connection failure of the external terminals 5, etc., can be effectively suppressed.

A preferred embodiment of the present invention is described above, and the present invention can also be carried out in other preferred embodiments.

Figure 8:
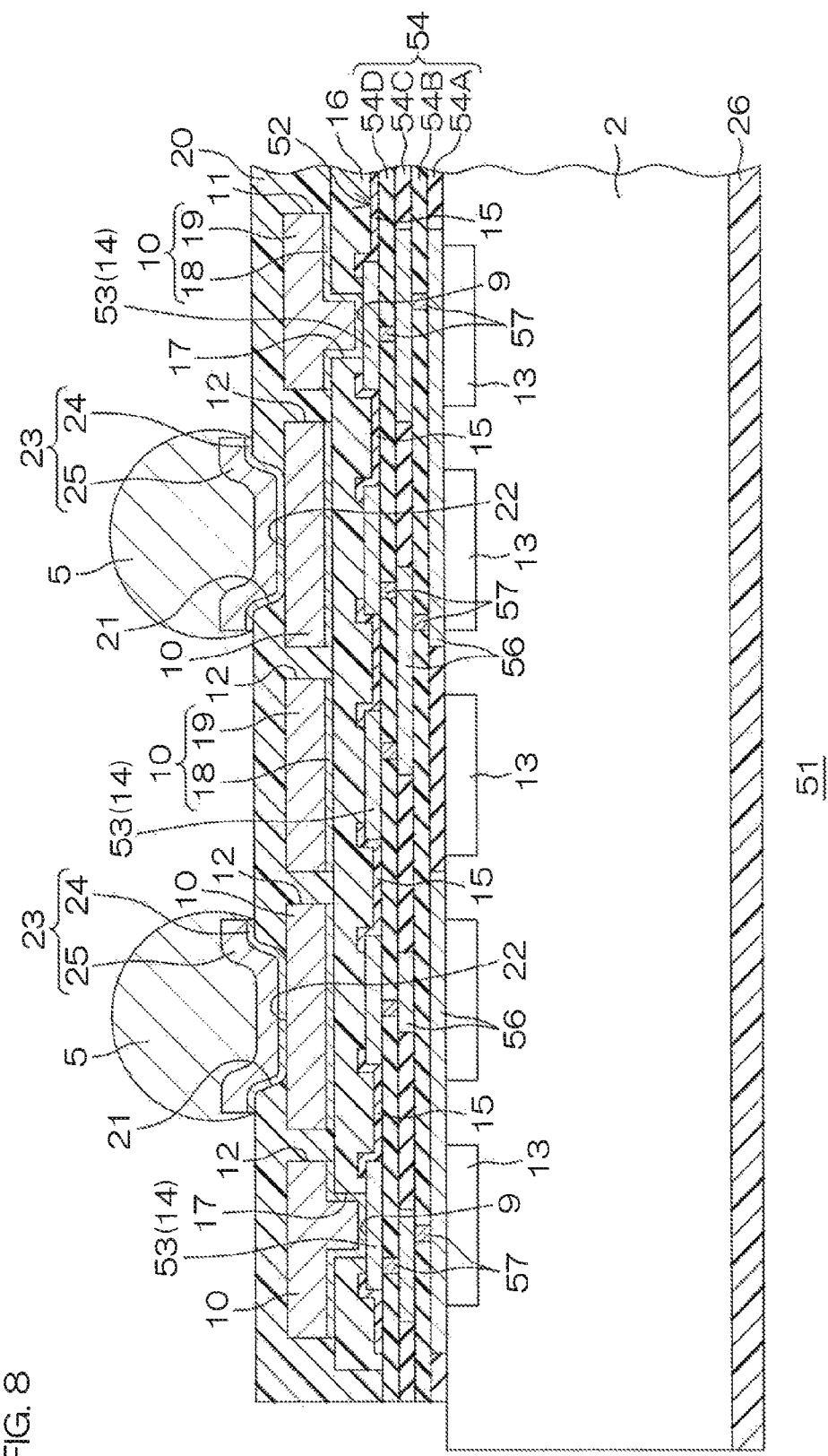
FIG. 8 is a schematic sectional view showing a first modified example of the semiconductor device shown in FIG. 1.

For example, in the above-described preferred embodiment, an example in which the electrode films 14 are directly connected to the impurity regions 13 constituting portions of LSI, etc., is described, however, an arrangement shown in FIG. 8 may be adopted.

FIG. 8 is a schematic sectional view showing a first modified example of the semiconductor device 1 shown in FIG. 1, corresponding to FIG. 4. The semiconductor device 51 shown in FIG. 8 is different from the above-described semiconductor device 1 in that a multilayer wiring structure 52 is formed between the impurity regions 13 and the electrode films 14, and the electrode films 14 are formed as uppermost layer wirings 53 of the multilayer wiring structure 52. The other arrangement is equivalent to that of the above-described semiconductor device 1. In FIG. 8, components corresponding to those in FIG. 1 to FIG. 7 are designated by the same reference signs, and will not be described.

As shown in FIG. 8, the multilayer wiring structure 52 includes a plurality of insulating layers 54 (first to fourth insulating layers 54A to 54D) and wiring films 56 and contacts 57 selectively formed in the plurality of insulating layers 54.

Each of the insulating layers 54A to 54D may include, for example, a silicon oxide film ($SiO_2$ film), a nitride film (SiN film), etc. Each of the insulating layers 54A to 54D may have a laminated structure including a plurality of insulating layers laminated.

In FIG. 8, an example in which wiring films 56 are formed in the first and third insulating layers 54A and 54C, and contacts 57 are formed in the second and fourth insulating layers 54B and 54D, is shown. The wiring films 56 formed in the first and third insulating layers 54A and 54C and the uppermost layer wirings 53 (electrode films 14) are electrically connected to each other via the contacts 57 formed in the second and fourth insulating layers 54B and 54D. Accordingly, power input into the external terminal 5 is input into the integrated circuit via the rewiring 10, the uppermost layer wiring 53 (electrode film 14), and the multilayer wiring structure 52. With this arrangement, the same effects as those of the above-described semiconductor device can also be obtained.

In the semiconductor device 51, the example in which the multilayer wiring structure 52 consisting of four layers is formed is described above, and it is also possible that a multilayer wiring structure 52 consisting of two or more layers is formed.

In the above-described preferred embodiment, an example in which a rewiring 10 consisting of one layer is formed is described, and it is also possible that a rewiring consisting of two or more layers is formed. In this case, the example shown in FIG. 9 may be adopted.

Figure 9:
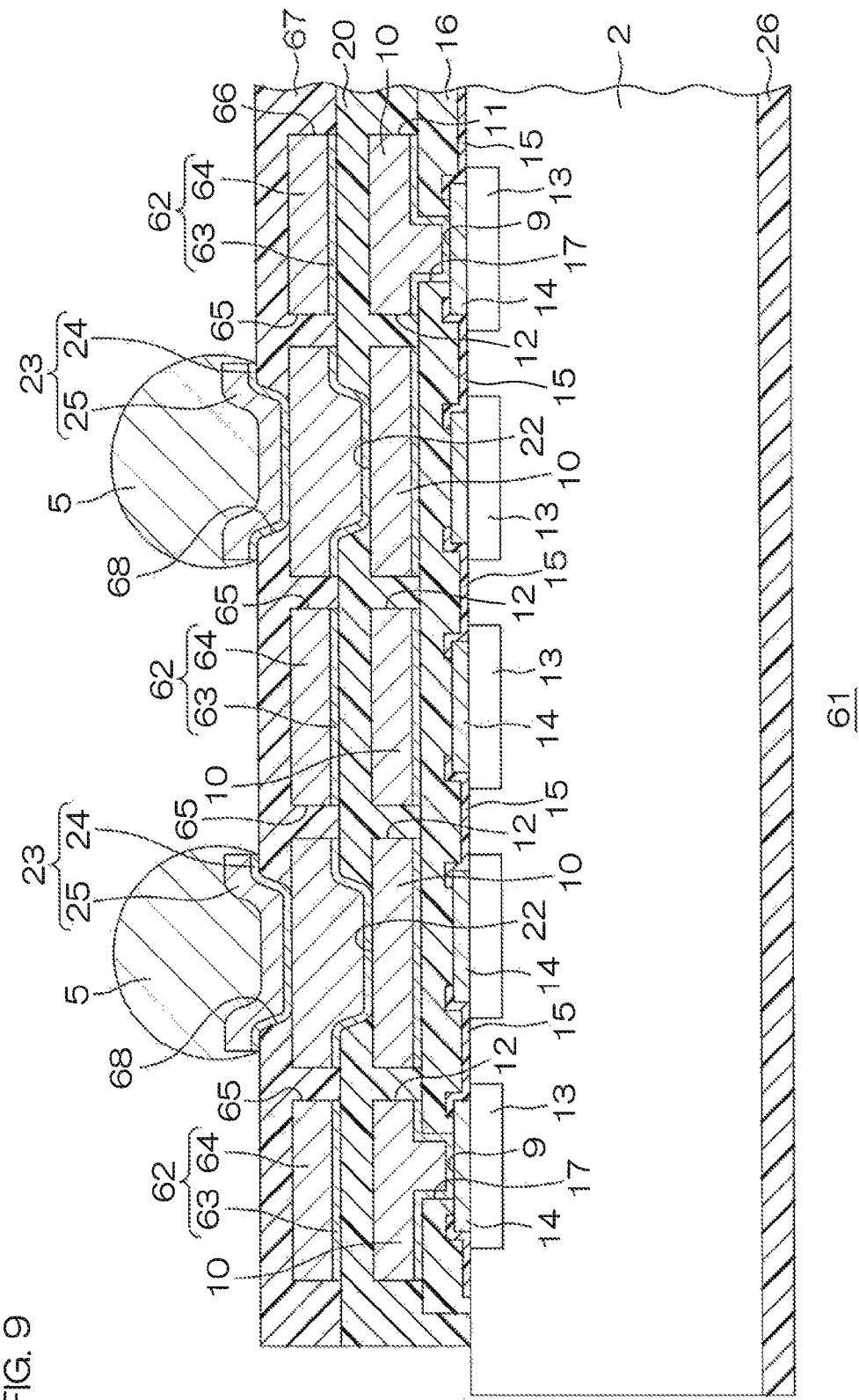
FIG. 9 is a schematic sectional view showing a second modified example of the semiconductor device shown in FIG. 1.

FIG. 9 is a schematic sectional view showing a second modified example of the semiconductor device 1 shown in FIG. 1, corresponding to FIG. 4. The semiconductor device 61 shown in FIG. 9 is different from the above-described semiconductor device 1 in that on the second resin layer 20 covering the rewiring 10 (hereinafter, referred to as a "first rewiring 10"), a second rewiring 62 (hereinafter, referred to as a "second rewiring 62") is further formed, and the external terminals 5 are electrically connected to the second rewiring 62. The other arrangement is equivalent to that of the above-described semiconductor device 1. In FIG. 9, components corresponding to those in FIG. 1 to FIG. 8 are designated by the same reference signs, and will not be described.

As shown in FIG. 9, on the rewiring pads 22, the second rewiring 62 routed on the second resin layer 20 is formed. The second rewiring 62 is formed so as to enter the insides of the rewiring pad openings 21 from the front surface of the second resin layer 20. The second rewiring 62 is electrically connected to the first rewiring 10 inside the rewiring pad openings 21. The second rewiring 62 may have the same planar shape as that of the first rewiring 10 (rewirings 10A to 10E, refer to FIG. 1), or may have a different planar shape. The second rewiring 62 is a rewiring layer including a UBM film 63 and a wiring film 64 formed on the UBM film 63.

The UBM film 63 is formed so that the front surface and the rear surface (surface on the semiconductor substrate side) thereof are along the front surface of the second resin layer 20, the inner surfaces of the rewiring pad openings 21, and the front surfaces of the rewiring pads 22. The UBM film 63 is electrically connected to the rewiring pad 22 inside the rewiring pad opening 21. The UBM film 63 may have a two-layer structure made of different conductive materials. In this case, the UBM film 63 may include a titanium film and a copper film formed on the titanium film.

The wiring film 64 is formed along the front surface of the UBM film 63 so as to further enter the concave spaces formed by making the UBM film 63 enter the insides of the rewiring pad openings 21. The wiring film 64 is electrically connected to the rewiring pads 22 via the UBM film 63. The content rate of the wiring film 64 with respect to the rewiring 10 is preferably larger than the content rate of the UBM film 63 with respect to the rewiring 10. The wiring film 64 is preferably formed to be thicker than the UBM film 63. The wiring film 64 may be a copper wiring film or an aluminum wiring film (a copper wiring film in the present modified example).

In a region along the periphery of the external terminal 5 in the second rewiring 62, a plurality of slits 65 and a removed portion 66 are formed. The respective slits 65 and the removed portion 66 are regions in which the second rewiring 62 is removed. From the respective slits 65 and the removed portion 66, the front surface of the second resin layer 20 is exposed. The disposition and the shapes of the respective slits 65 and the removed portion 66 are the same as those of the slits 12 and the removed portion 11 in the above-described semiconductor device 1. A third resin layer 67 is formed so as to cover the second rewiring 62.

The third resin layer 67 may be made of, for example, a photosensitive resin. In detail, the third resin layer 67 may be made of a polyimide resin, a polybenzoxasole resin, an epoxy resin, a phenol resin, or the like. The third resin layer 67 is preferably made of the same material as that of the first resin layer 16 and the second resin layer 20.

The third resin layer 67 is formed so as to enter the insides of the plurality of slits 65 and the removed portion 66 formed in the second rewiring 62 and backfill the slits 65 and the removed portion 66. The third resin layer 67 is in contact with the front surface of the second resin layer 20 inside the respective slits 65 and the removed portion 66. Inside the respective slits 65 and the removed portion 66, the third resin layer 67 is preferably in close contact with the second resin layer 20.

The third resin layer 67 has second rewiring pad openings 68 that expose portions of the second rewiring 62 as second rewiring pads 69. The second rewiring pad openings 68 may be substantially rectangular in planar view, or may be substantially circular in planar view. On the second rewiring pads 69, electrode posts 23 are formed so as to project from the front surface of the third resin layer 67. To the electrode posts 23, the external terminals 5 are connected.

With this arrangement, the same effects as those of the above-described semiconductor device 1 can also be obtained. Further, with this arrangement, by the third resin layer 67 entering the respective slits 65 of the second rewiring 62, an anchor effect can be obtained. Accordingly, peeling of the third resin layer 67 from the second rewiring 62 can be suppressed. In addition, a stress generated in the second rewiring 62 can be relaxed by the respective slits 65, so that occurrence of a crack at the opening end of the second rewiring pad opening 68 can be suppressed.

In the above-described preferred embodiment, an example in which four slits 12 are formed in a region along the periphery of the external terminal 5 in the rewiring 10 is described, however, four or more slits 12 may be formed in the rewiring 10.

Figure 10:
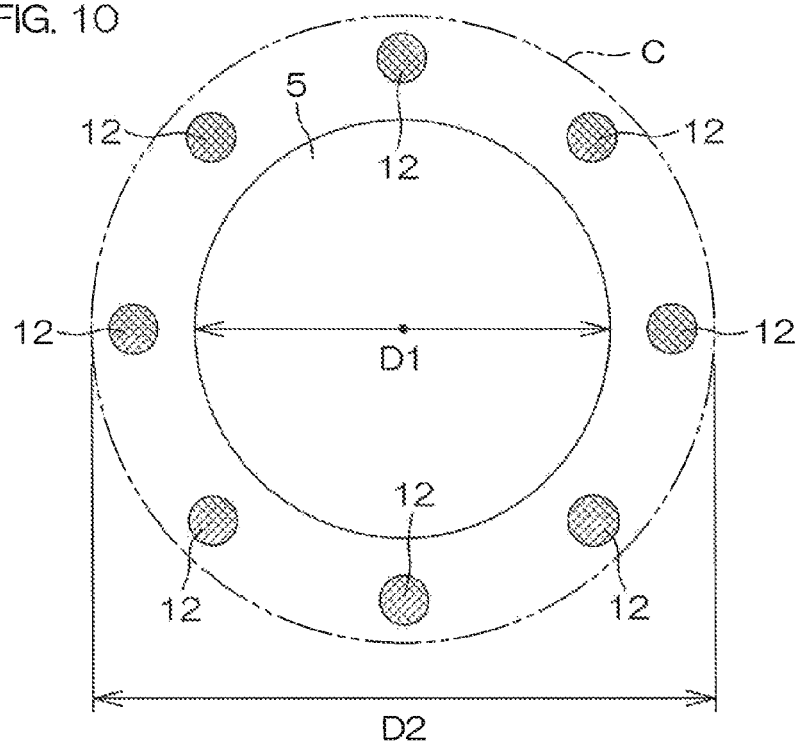
FIG. 10 is a schematic sectional view showing a first modified example of the slits.
Figure 11:
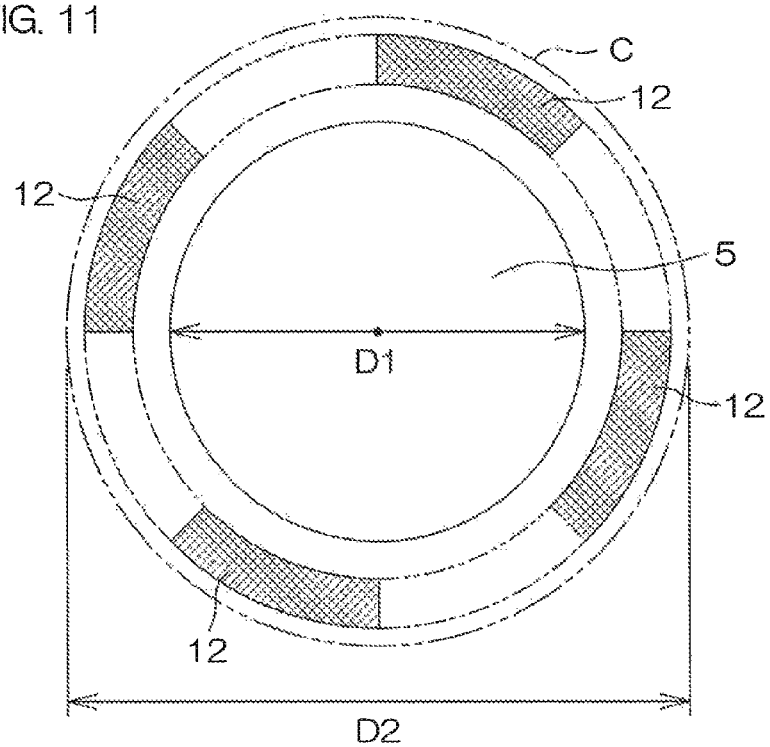
FIG. 11 is a schematic sectional view showing a second modified example of the slits.

In the above-described preferred embodiment, the examples shown in FIG. 10 and FIG. 11 may be adopted. FIG. 10 and FIG. 11 are schematic sectional views showing a first modified example and a second modified example of the slits 12. In FIG. 10 and FIG. 11, the planar shape of the external terminal 5 is shown by a solid line, and a portion at which a slit 12 is formed is shown by cross hatching.

As shown in FIG. 10, each slit 12 may be formed to be substantially circular in planar view. A plurality (four or more, eight in the present modified example) of slits 12 may be formed along the periphery of the external terminal 5 in the rewiring 10. Each slit 65 preferably has a diameter of 15 μm or more. Each slit 12 may be formed to be, instead of substantially circular in planar view, substantially polygonal in planar view such as substantially oval in planar view, substantially hexagonal in planar view, or substantially octagonal in planar view.

As shown in FIG. 11, a plurality of slits 12 may be formed along a region having a substantially toric shape in planar view surrounding the periphery of the external terminal 5. In a case where closed-circular slits 12 are formed, electrical connection between the external terminal 5 and the rewiring 10 is impossible, and therefore, the slits 12 are spaced from each other. Each slit 12 preferably has a width of 15 μm or more. The plurality of slits 12 may be formed along a region having a substantially quadrangular ring shape instead of the region having a substantially toric shape in planar view.

In the above-described preferred embodiment, the slits 12 may also be formed in the rewiring 7. In the above-described preferred embodiment, the removed portion 11 may be formed in a region facing the electrode pad 9. Similarly, the plurality of slits 12 may be formed in a region facing the electrode pad 9.

In the above-described preferred embodiment, an example in which the external terminal 5 constitutes a connection terminal to be connected to a connecting target is described, however, an arrangement can also be adopted in which the external terminals 5 are not formed, and each electrode post 23 is connected to a connecting target directly or via a bonding member (for example, a bonding member such as solder paste or a bonding wire). In this case, the electrode post 23 may be regarded as an external terminal.

In the above-described preferred embodiment, an example of a step of forming the rewiring 10 by deposition by plating via the resist mask 30 (slit mask 32) is described, however, instead of this, the following manufacturing method may be adopted.

That is, after the wiring film 19 is formed on the UBM film 18, a resist mask corresponding to the final shape of the rewiring 10 (that is, the shapes of the rewirings 10A to 10E) is formed on the wiring film 19. The resist mask selectively has openings in a region in which the removed portion 11 should be formed and regions in which the slits 12 should be formed. By etching via the resist mask, unnecessary portions of the wiring film 19 and the UBM film 18 are removed. Accordingly, the rewiring 10 is formed. Even by this method, the rewiring 10 having the removed portion 11 and the slits 12 is formed.

Besides, the design can be variously changed within the scope of the matters described in the claims.

What is claimed is:

1. A manufacturing method for a semiconductor device, comprising:
    forming a plurality of pads on a semiconductor substrate;
    forming a rewiring that is electrically connected to the at least one pad and led to a region outside the pad;
    forming a resin layer on the rewiring; and
    forming an external terminal so that the external terminal is electrically connected to the rewiring, wherein
    the forming of the rewiring includes forming a slit in a region along a periphery of the external terminal in the rewiring,
    the resin layer is formed so as to enter an inside of the slit, and
    the plurality of pads include a first pad which is connected to the rewiring at a region outside the external terminal in planar view and a second pad which is not connected to the rewiring and is disposed directly beneath the external terminal in planar view.

2. The manufacturing method for a semiconductor device according to claim 1, wherein the rewiring in common is formed to cover the plurality of pads.

3. The manufacturing method for a semiconductor device according to claim 1, further comprising:
    forming an opening to selectively expose the rewiring in the resin layer, wherein
    the external terminal is formed so as to be electrically connected to the rewiring via the opening of the resin layer.

4. The manufacturing method for a semiconductor device according to claim 1, wherein in a case where the size of the external terminal in planar view is defined as 100%, the slit is formed in a region of 150% or less with respect to the size of the external terminal in planar view.

5. The manufacturing method for a semiconductor device according to claim 4, wherein
    the external terminal is formed to be circular in planar view, and
    in the region of 150% or less, when a quadrangle that houses the external terminal is drawn, the slit is formed between a peripheral edge portion of the external terminal and a peripheral edge portion of the quadrangle.

6. The manufacturing method for a semiconductor device according to claim 1, wherein a plurality of the slits are formed.

7. The manufacturing method for a semiconductor device according to claim 1, wherein the forming the rewiring includes
    forming a mask including a slit mask that selectively covers a region in which the slit should be formed with a width of 15 μm or more, and
    forming of the rewiring having the slit by depositing a conductive material via the mask.

8. The manufacturing method for a semiconductor device according to claim 1, wherein
    the rewiring including copper wiring is formed, and
    the resin layer including a polyimide layer is formed.

9. The manufacturing method for a semiconductor device according to claim 1, further comprising:
    forming a second rewiring on the resin layer and electrically connected to the rewiring; and
    forming a second resin layer on the resin layer, wherein
    the external terminal is electrically connected to the second rewiring, and
    the second resin layer enters an inside of a second slit formed in a region along the periphery of the external terminal in the second rewiring.

* * * * *